(12) United States Patent
Ouye

(10) Patent No.: US 9,236,284 B2
(45) Date of Patent: Jan. 12, 2016

(54) COOLED TAPE FRAME LIFT AND LOW CONTACT SHADOW RING FOR PLASMA HEAT ISOLATION

(71) Applicant: Alan Hiroshi Ouye, San Mateo, CA (US)

(72) Inventor: Alan Hiroshi Ouye, San Mateo, CA (US)

(73) Assignee: Applied Materials, Inc., Santa Clara, CA (US)

( * ) Notice: Subject to any disclaimer, the term of this patent is extended or adjusted under 35 U.S.C. 154(b) by 69 days.

(21) Appl. No.: 14/169,356

(22) Filed: Jan. 31, 2014

(65) Prior Publication Data

US 2015/0221553 A1 Aug. 6, 2015

(51) Int. Cl.
*H01L 21/26* (2006.01)
*H01L 21/42* (2006.01)
(Continued)

(52) U.S. Cl.
CPC .......... *H01L 21/683* (2013.01); *H01J 37/32522* (2013.01); *H01J 37/32642* (2013.01); *H01J 37/32651* (2013.01); *H01L 21/3065* (2013.01); *H01L 21/78* (2013.01); *H01J 2237/33* (2013.01)

(58) Field of Classification Search
CPC ................. H01L 21/02271; H01L 21/67132; H01L 21/02337; H01L 21/28079; H01L 21/02529; H01L 21/02672; H01L 21/67721; H01L 21/3003; H01L 21/02178; H01L 21/0231; H01L 21/02348; H01L 21/67069; H01L 21/67075; H01L 21/67098; H01L 21/687; H01L 27/0814; H01L 29/6603; C23C 16/277; C23C 14/5826; C30B 23/063; C30B 31/12; B23K 26/18; B23K 26/043
USPC ............. 438/9, 106, 141, 142, 199, 308, 328, 438/463, 474, 475, 487, 502, 509, 535, 513, 438/602, 603, 604, 706, 745, 732, 913; 257/173, 200, 201, 204, 277, 292, 257/E21.006, E21.028, E21.053, E21.054, 257/E21.077, E21.085, E21.134, E21.218, 257/E21.229, E21.253, E21.256, E21.267, 257/E21.311, E21.319, E21.329, E21.347, 257/E21.352
See application file for complete search history.

(56) References Cited

U.S. PATENT DOCUMENTS

| 4,049,944 A | 9/1977 | Garvin et al. |
| 4,339,528 A | 7/1982 | Goldman |

(Continued)

FOREIGN PATENT DOCUMENTS

| JP | 9216085 | 8/1997 |
| JP | 10321908 | 12/1998 |

(Continued)

OTHER PUBLICATIONS

Linder, V. et al., "Water-Soluble Sacrificial Layers for Surface Micromachining", www.small-journal.com, 2005, 1, No. 7, 7 pgs.

(Continued)

*Primary Examiner* — David Nhu
(74) *Attorney, Agent, or Firm* — Blakely Sokoloff Taylor Zafman LLP

(57) ABSTRACT

Methods of and apparatuses for dicing semiconductor wafers, each wafer having a plurality of integrated circuits, are described. In an example, a tape frame lift assembly for a plasma processing chamber includes a capture single ring having an upper surface for supporting a tape frame of a substrate support and for cooling the tape frame. The tape frame lift assembly also includes one or more capture lift arms for moving the capture single ring to and from transfer and processing positions. The tape frame assembly also includes one or more captured lift plate portions, one captured lift plate portion corresponding to one capture lift arm, the one or more captured lift plate portions for coupling the one or more capture lift arms to the capture single ring.

13 Claims, 22 Drawing Sheets

(51) Int. Cl.
  *H01L 21/683* (2006.01)
  *H01L 21/78* (2006.01)
  *H01J 37/32* (2006.01)
  *H01L 21/3065* (2006.01)

(56) References Cited

U.S. PATENT DOCUMENTS

| | | | |
|---|---|---|---|
| 4,684,437 A | 8/1987 | Donelon et al. | |
| 5,336,638 A | 8/1994 | Suzuki et al. | |
| 5,593,606 A | 1/1997 | Owen et al. | |
| 5,691,794 A | 11/1997 | Hoshi et al. | |
| 6,051,503 A | 4/2000 | Bhardwaj et al. | |
| 6,057,180 A | 5/2000 | Sun et al. | |
| 6,174,271 B1 | 1/2001 | Kosmowski | |
| 6,300,593 B1 | 10/2001 | Powell | |
| 6,306,731 B1 | 10/2001 | Igarashi et al. | |
| 6,407,363 B2 | 6/2002 | Dunsky et al. | |
| 6,426,275 B1 | 7/2002 | Arisa | |
| 6,465,158 B1 | 10/2002 | Sekiya | |
| 6,528,864 B1 | 3/2003 | Arai | |
| 6,574,250 B2 | 6/2003 | Sun et al. | |
| 6,582,983 B1 | 6/2003 | Runyon et al. | |
| 6,593,542 B2 | 7/2003 | Baird et al. | |
| 6,642,127 B2 | 11/2003 | Kumar et al. | |
| 6,676,878 B2 | 1/2004 | O'Brien et al. | |
| 6,696,669 B2 | 2/2004 | Hembree et al. | |
| 6,706,998 B2 | 3/2004 | Cutler | |
| 6,759,275 B1 | 7/2004 | Lee et al. | |
| 6,803,247 B2 | 10/2004 | Sekiya | |
| 6,887,804 B2 | 5/2005 | Sun et al. | |
| 6,998,571 B2 | 2/2006 | Sekiya et al. | |
| 7,128,806 B2 | 10/2006 | Nguyen et al. | |
| 7,129,150 B2 | 10/2006 | Kawai | |
| 7,179,723 B2 | 2/2007 | Genda et al. | |
| 7,265,033 B2 | 9/2007 | Shigematsu et al. | |
| 7,361,990 B2 | 4/2008 | Lu et al. | |
| 7,364,986 B2 | 4/2008 | Nagai et al. | |
| 7,435,607 B2 | 10/2008 | Nagai | |
| 7,459,377 B2 | 12/2008 | Ueda et al. | |
| 7,468,309 B2 | 12/2008 | Shigematsu et al. | |
| 7,473,866 B2 | 1/2009 | Morishige et al. | |
| 7,507,638 B2 | 3/2009 | Mancini et al. | |
| 7,507,639 B2 | 3/2009 | Nakamura | |
| 7,629,228 B2 | 12/2009 | Haji et al. | |
| 7,678,670 B2 | 3/2010 | Arita et al. | |
| 7,687,740 B2 | 3/2010 | Bruland et al. | |
| 7,754,584 B2 | 7/2010 | Kumakawa | |
| 7,767,551 B2 | 8/2010 | Arita et al. | |
| 7,767,554 B2 | 8/2010 | Arita et al. | |
| 7,776,720 B2 | 8/2010 | Boyle et al. | |
| 7,804,043 B2 | 9/2010 | Deshi | |
| 7,838,323 B2 | 11/2010 | Utsumi et al. | |
| 7,859,084 B2 | 12/2010 | Utsumi et al. | |
| 7,875,898 B2 | 1/2011 | Maeda | |
| 7,906,410 B2 | 3/2011 | Arita et al. | |
| 7,923,351 B2 | 4/2011 | Arita | |
| 7,926,410 B2 | 4/2011 | Bair | |
| 7,927,973 B2 * | 4/2011 | Haji et al. | 438/462 |
| 8,642,448 B2 * | 2/2014 | Lei et al. | 438/463 |
| 9,034,771 B1 * | 5/2015 | Nangoy | 438/710 |
| 9,048,309 B2 * | 6/2015 | Chowdhury et al. | 1/1 |
| 2003/0162313 A1 | 8/2003 | Kim et al. | |
| 2004/0080045 A1 | 4/2004 | Kimura et al. | |
| 2004/0137700 A1 | 7/2004 | Sekiya | |
| 2004/0157457 A1 | 8/2004 | Xu et al. | |
| 2004/0212047 A1 | 10/2004 | Joshi et al. | |
| 2006/0043535 A1 | 3/2006 | Hiatt | |
| 2006/0086898 A1 | 4/2006 | Cheng et al. | |
| 2006/0088984 A1 | 4/2006 | Li et al. | |
| 2006/0146910 A1 | 7/2006 | Koochesfahani et al. | |
| 2006/0205182 A1 | 9/2006 | Soejima | |
| 2008/0072823 A1 | 3/2008 | Yudovsky et al. | |
| 2009/0255911 A1 | 10/2009 | Krishnaswami et al. | |
| 2010/0013036 A1 | 1/2010 | Carey | |
| 2010/0216313 A1 | 8/2010 | Iwai et al. | |
| 2010/0248451 A1 | 9/2010 | Pirogovsky et al. | |
| 2011/0014777 A1 | 1/2011 | Haji et al. | |
| 2011/0259211 A1 | 10/2011 | Smith | |
| 2011/0312157 A1 | 12/2011 | Lei et al. | |
| 2012/0322239 A1 | 12/2012 | Singh et al. | |
| 2013/0045554 A1 | 2/2013 | Yamazaki | |
| 2013/0065378 A1 | 3/2013 | Johnson et al. | |
| 2013/0230972 A1 | 9/2013 | Johnson et al. | |
| 2013/0230973 A1 | 9/2013 | Gauldin et al. | |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| JP | 2012238732 | 12/2012 |
| WO | WO-03036712 | 5/2003 |
| WO | WO-03071591 | 5/2003 |

OTHER PUBLICATIONS

Singh, Saravjeet et al., "Apparatus and Methods for Dry Etch With Edge, Side and Back Protection", U.S. Appl. No. 61/491,693, filed May 31, 2011 24 pgs.

Ouye, et al., U.S. Appl. No. 14/109,808 entitled "Actively-Cooled Shadow Ring for Heat Dissipation in Plasma Chamber," filed Dec. 17, 2013, 66 pgs.

Ouye, et al., U.S. Appl. No. 14/109,820 entitled "Plasma Thermal Shield for Heat Dissipation in Plasma Chamber," filed Dec. 17, 2013, 67 pgs.

Lei, et al., U.S. Appl. No. 14/158,529 entitled "Laser and Plasma Etch Wafer Dicing With Etch Chamber Shield Ring for Film Frame Wafer Applications," filed Jan. 17, 2014, 38 pgs.

International Search Report and Written Opinion for PCT/US2015/011480 mailed Apr. 28, 2015, 10 pages.

Non-Final Office Action from U.S. Appl. No. 14/219,851 mailed Dec. 23, 2014, 9 pgs.

Final Office Action from U.S. Appl. No. 14/219,851 mailed Apr. 1, 2015, 7 pgs.

* cited by examiner

TOP VIEW
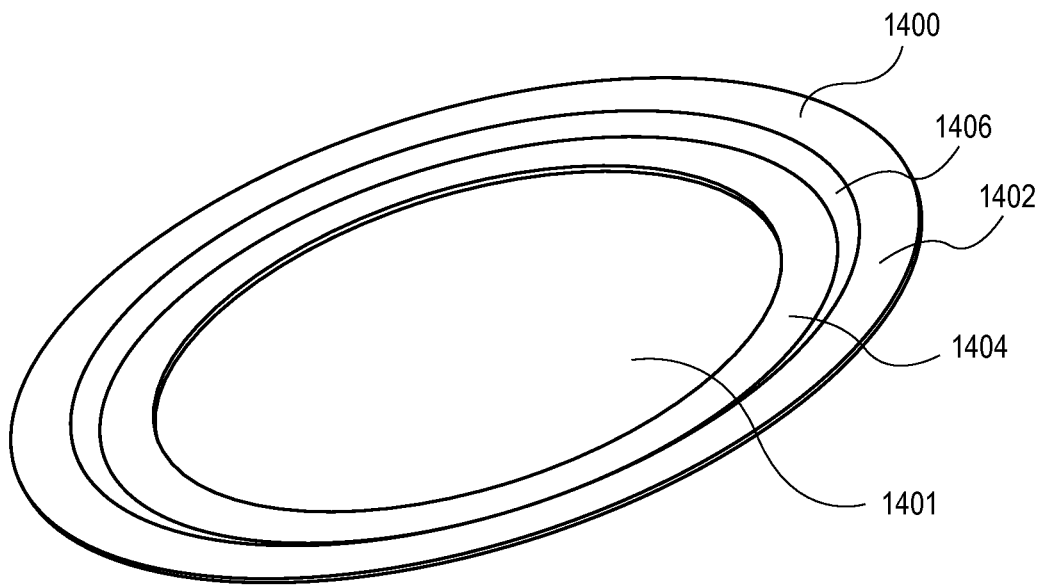
BOTTOM VIEW
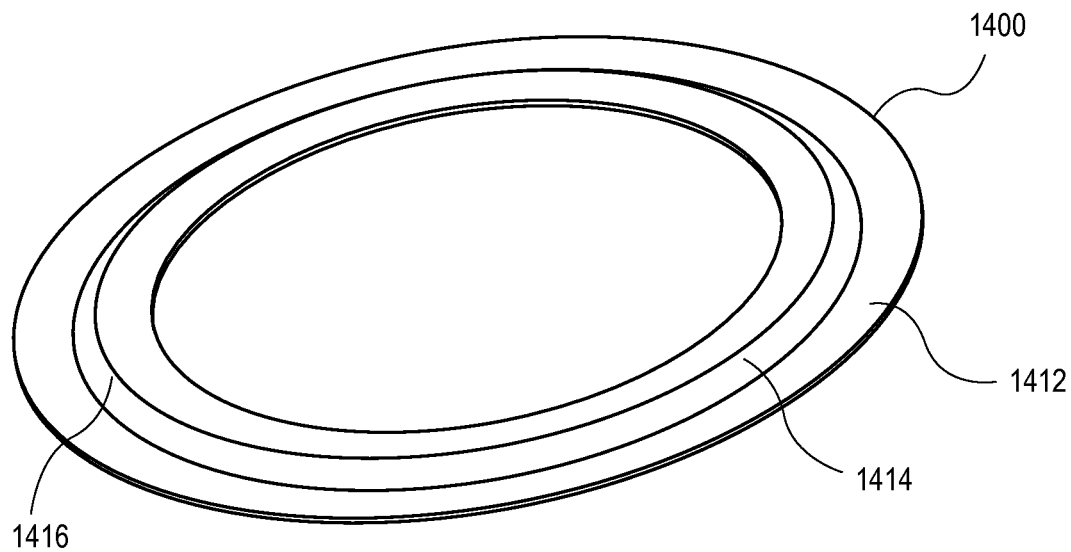
FIG. 14

COOLED TAPE FRAME LIFT AND LOW CONTACT SHADOW RING FOR PLASMA HEAT ISOLATION

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dies.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dies. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dies. In addition, cracks can form and propagate from the edges of the dies into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is required between the dies on the wafer to prevent damage to the integrated circuits, e.g., the chips and cracks are maintained at a distance from the actual integrated circuits. As a result of the spacing requirements, not as many dies can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dies. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

Embodiments of the present invention include methods of dicing semiconductor wafers, each wafer having a plurality of integrated circuits thereon.

In an embodiment, a tape frame lift assembly for a plasma processing chamber includes a capture single ring having an upper surface for supporting a tape frame of a substrate support and for cooling the tape frame. The tape frame assembly also includes one or more capture lift arms for moving the capture single ring to and from transfer and processing positions. The tape frame lift assembly also includes one or more captured lift plate portions, one captured lift plate portion corresponding to one capture lift arm, the one or more captured lift plate portions for coupling the one or more capture lift arms to the capture single ring.

In another embodiment, a shadow ring assembly for a plasma processing chamber includes a shadow ring having an annular body and an inner opening for accommodating an etch cathode. The shadow ring assembly also includes a tape frame lift assembly disposed below the shadow ring. The tape frame lift assembly includes a capture single ring having an upper surface for supporting a tape frame of a substrate support and for cooling the tape frame. The capture single ring is an annular ring with an inner opening for accommodating the etch cathode. During processing, both the capture single ring and the shadow ring contact the tape frame of the substrate support. The tape frame lift assembly also includes one or more capture lift arms for moving the capture single ring to and from transfer and processing positions. The tape frame lift assembly also includes one or more captured lift plate portions, one captured lift plate portion corresponding to one capture lift arm. The one or more captured lift plate portions are for coupling the one or more capture lift arms to the capture single ring.

In another embodiment, a method of dicing a semiconductor wafer having a plurality of integrated circuits involves introducing a substrate supported by a substrate carrier into a plasma etch chamber, the substrate having a patterned mask thereon covering integrated circuits and exposing streets of the substrate, and the substrate carrier having a tape frame. The method also involves supporting the substrate carrier on a cooled tape frame lift below a shadow ring. The method also involves plasma etching the substrate through the streets to singulate the integrated circuits. The shadow ring protects the substrate carrier from the plasma etching, and the cooled tape frame lift draws heat away from the tape frame of the substrate carrier.

BRIEF DESCRIPTION OF THE DRAWINGS

FIG. 14 illustrates an angled top view and angled bottom view of a plasma thermal shield, in accordance with an embodiment of the present invention.

DETAILED DESCRIPTION

Figure 1:
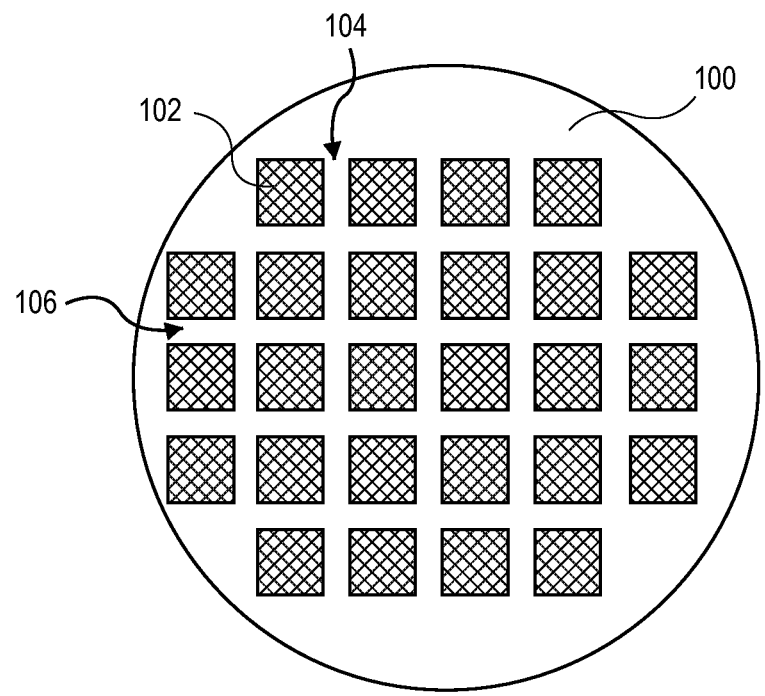
FIG. 1 illustrates a top plan of a semiconductor wafer to be diced, in accordance with an embodiment of the present invention.

Methods of and apparatuses for dicing semiconductor wafers, each wafer having a plurality of integrated circuits thereon, are described. In the following description, numerous specific details are set forth, such as substrate carriers for thin wafers, scribing and plasma etching conditions and material regimes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to a cooled tape frame lift, e.g., a helium-cooled tape frame lift. One or more embodiments are further directed to a low contact shadow ring for plasma heat isolation.

In an exemplary application, and to provide context, a wafer or substrate die singulation process involves placing a thinned wafer or substrate on a flexible polymer tape with an adhesive. The flexible polymer tape is then attached to a supportive tape frame ring. In some aspects, the only rigid form for reliable pick and place motion of singulated die is the tape frame. However, the radial location of the tape frame is typically outside of the normal range of a wafer lift mechanism such as is used in a plasma etch chamber. Additionally, the tape and tape frame pairing should typically not be exposed to temperatures that exceed the allowable temperature of the tape and adhesive.

Addressing one or more of the above issues, in accordance with one or more embodiments described herein, the overall design of a tape frame lift includes a mechanism to hold and cool a wafer or substrate. In one such embodiment, the tape frame lift is s singular lift mechanism, which further includes a set of components for picking and placing the tape frame, and a set of components to shield the tape and tape frame from plasma temperature. In one such embodiment, a substrate or wafer is held in place with an electrostatic chuck (ESC) that also provides backside helium cooling to maintain the substrate or wafer to an acceptable temperature. Helium leakage that occurs at the outer perimeter of the ESC can be advantageously directed to provide a conductive medium to cool the tape and tape frame.

In an aspect of the present disclosure, a hybrid wafer or substrate dicing process involving an initial laser scribe and subsequent plasma etch may be implemented for die singulation. The laser scribe process may be used to cleanly remove a mask layer, organic and inorganic dielectric layers, and device layers. The laser etch process may then be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing. In one embodiment, a cooled tape frame lift is implemented during the etch portion of the dicing process. In an embodiment, the wafer or substrate is supported by a substrate carrier having a tape frame during the singulation process, including during the etch portion of the singulation process.

In accordance with an embodiment of the present invention, described herein are one or more apparatuses for, and methods of, cooling a tape frame of a substrate carrier during plasma etch in a singulation process. For example, an apparatus may be used to support and cool the film frame used to hold a thin silicon wafer on a tape supported by the frame. The manufacturing processes related to integrated circuit (IC) packaging may require that a thinned silicon wafer be supported and mounted on a film such as a die attach film. In one embodiment, a die attach film is also supported by a substrate carrier and is used to adhere a thin silicon wafer to the substrate carrier.

To provide context, conventional wafer dicing approaches include diamond saw cutting based on a purely mechanical separation, initial laser scribing and subsequent diamond saw dicing, or nanosecond or picosecond laser dicing. For thin wafer or substrate singulation, such as 50 microns thick bulk silicon singulation, the conventional approaches have yielded only poor process quality. Some of the challenges that may be faced when singulating die from thin wafers or substrates may include microcrack formation or delamination between different layers, chipping of inorganic dielectric layers, retention of strict kerf width control, or precise ablation depth control. Embodiments of the present invention include a hybrid laser scribing and plasma etching die singulation approach that may be useful for overcoming one or more of the above challenges.

In accordance with an embodiment of the present invention, a combination of laser scribing and plasma etching is used to dice a semiconductor wafer into individualized or singulated integrated circuits. In one embodiment, femtosecond-based laser scribing is used as an essentially, if not totally, non-thermal process. For example, the femtosecond-based laser scribing may be localized with no or negligible heat damage zone. In an embodiment, approaches herein are used to singulated integrated circuits having ultra-low k films. With convention dicing, saws may need to be slowed down to accommodate such low k films. Furthermore, semiconductor wafers are now often thinned prior to dicing. As such, in an embodiment, a combination of mask patterning and partial wafer scribing with a femtosecond-based laser, followed by a plasma etch process, is now practical. In one embodiment, direct writing with laser can eliminate need for a lithography patterning operation of a photo-resist layer and can be implemented with very little cost. In one embodiment, through-via type silicon etching is used to complete the dicing process in a plasma etching environment.

Figure 2:
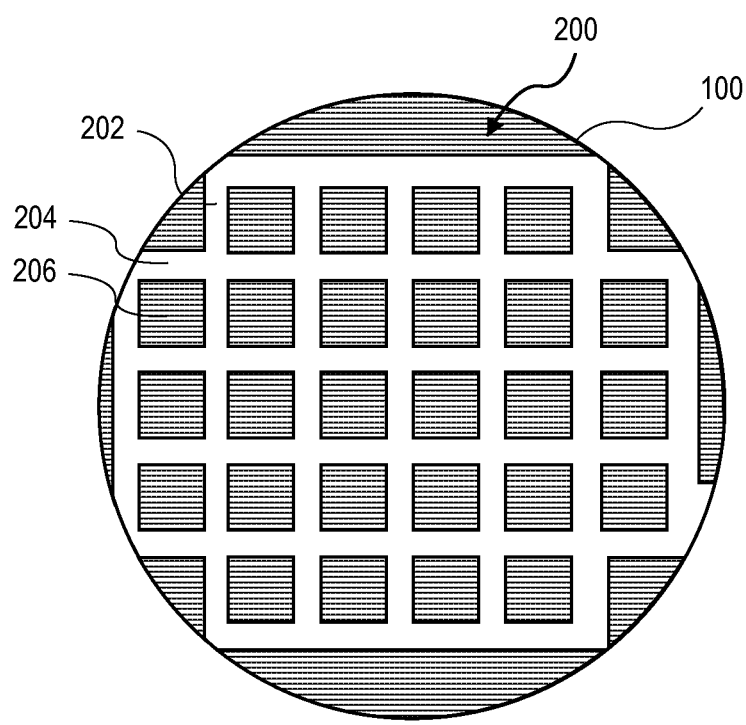
FIG. 2 illustrates a top plan of a semiconductor wafer to be diced that has a dicing mask formed thereon, in accordance with an embodiment of the present invention.

Thus, in an aspect of the present invention, a combination of laser scribing and plasma etching may be used to dice a semiconductor wafer into singulated integrated circuits. FIG. 1 illustrates a top plan of a semiconductor wafer to be diced, in accordance with an embodiment of the present invention. FIG. 2 illustrates a top plan of a semiconductor wafer to be diced that has a dicing mask formed thereon, in accordance with an embodiment of the present invention.

Referring to FIG. 1, a semiconductor wafer 100 has a plurality of regions 102 that include integrated circuits. The regions 102 are separated by vertical streets 104 and horizontal streets 106. The streets 104 and 106 are areas of semiconductor wafer that do not contain integrated circuits and are designed as locations along which the wafer will be diced. Some embodiments of the present invention involve the use of a combination laser scribe and plasma etch technique to cut trenches through the semiconductor wafer along the streets such that the dies are separated into individual chips or die. Since both a laser scribe and a plasma etch process are crystal structure orientation independent, the crystal structure of the semiconductor wafer to be diced may be immaterial to achieving a vertical trench through the wafer.

Referring to FIG. 2, the semiconductor wafer 100 has a mask 200 deposited upon the semiconductor wafer 100. In one embodiment, the mask is deposited in a conventional manner to achieve an approximately 4-10 micron thick layer. The mask 200 and a portion of the semiconductor wafer 100 are, in one embodiment, patterned with a laser scribing process to define the locations (e.g., gaps 202 and 204) along the streets 104 and 106 where the semiconductor wafer 100 will be diced. The integrated circuit regions of the semiconductor wafer 100 are covered and protected by the mask 200. The regions 206 of the mask 200 are positioned such that during a subsequent etching process, the integrated circuits are not degraded by the etch process. Horizontal gaps 204 and vertical gaps 202 are formed between the regions 206 to define the areas that will be etched during the etching process to finally dice the semiconductor wafer 100. In accordance with an embodiment of the present invention, a cooled tape frame lift is implemented during the etch portion of the dicing process.

As mentioned briefly above, a substrate for dicing is supported by a substrate carrier during the plasma etching portion of a die singulation process, e.g., of a hybrid laser ablation and plasma etching singulation scheme. For example, FIG. 3 illustrates a plan view of a substrate carrier suitable for supporting a wafer during a singulation process, in accordance with an embodiment of the present invention.

Figure 3:
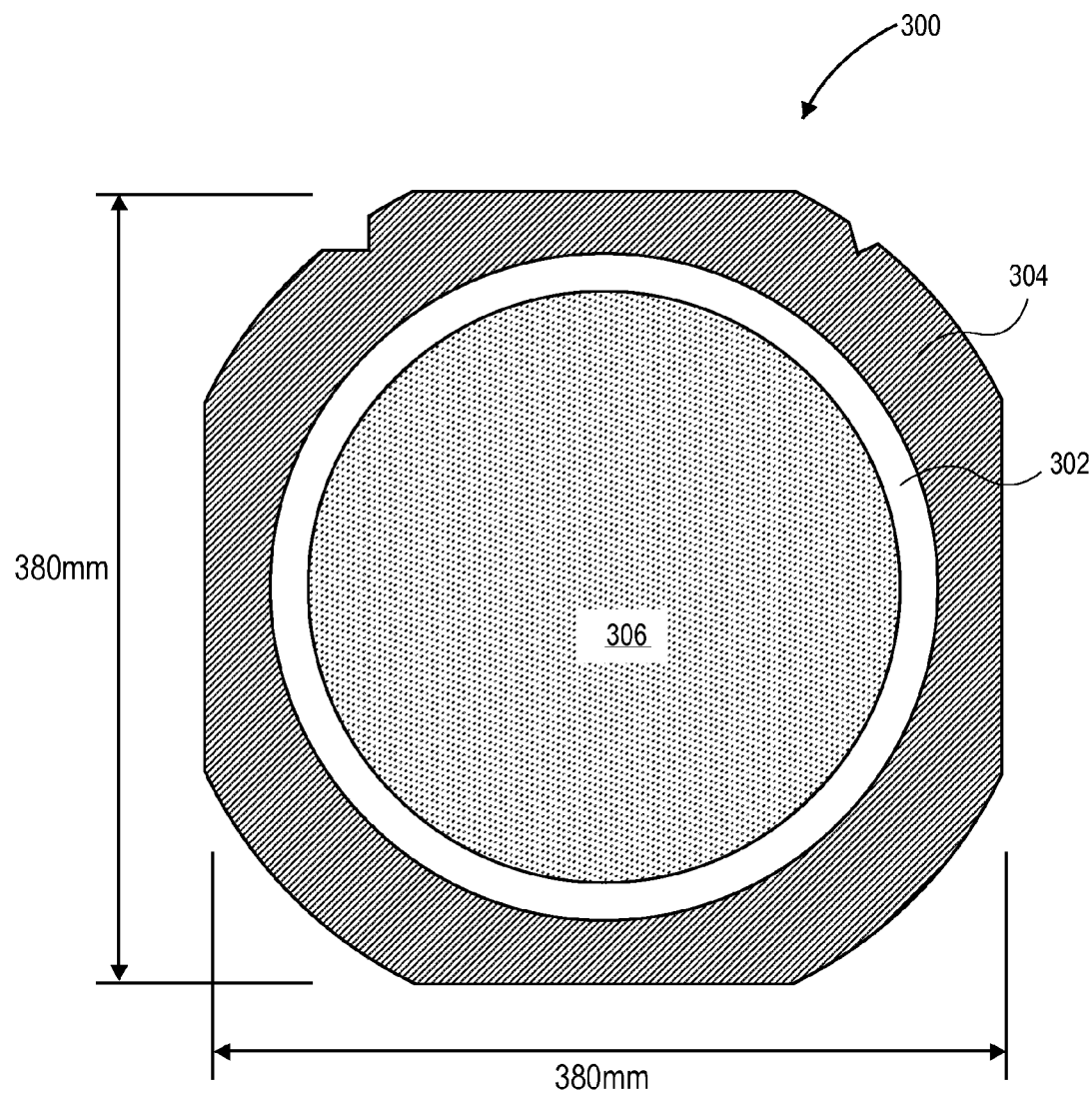
FIG. 3 illustrates a plan view of a substrate carrier suitable for supporting a wafer during a singulation process, in accordance with an embodiment of the present invention.

Referring to FIG. 3, a substrate carrier 300 includes a layer of backing tape 302 surrounded by a tape ring or frame 304. A wafer or substrate 306 is supported by the backing tape 302 of the substrate carrier 300. In one embodiment, the wafer or substrate 306 is attached to the backing tape 302 by a die attach film. In one embodiment, the tape ring 304 is composed of stainless steel.

In an embodiment, a singulation process can be accommodated in a system sized to receive a substrate carrier such as the substrate carrier 300. In one such embodiment, a system such as system 2200, described in greater detail below, can accommodate a wafer frame without impact on the system footprint that is otherwise sized to accommodate a substrate or wafer not supported by a substrate carrier. In one embodiment, such a processing system is sized to accommodate 300 millimeter-in-diameter wafers or substrates. The same system can accommodate a wafer carrier approximately 380 millimeters in width by 380 millimeters in length, as depicted in FIG. 3. However, it is to be appreciated that systems may be designed to handle 450 millimeter wafers or substrate or, more particularly, 450 millimeter wafer or substrate carriers.

In an aspect of the present invention, one or more embodiments are directed to a tape frame lift. In one such embodiment, a substrate carrier is cooled by the tape frame lift during a plasma etching process.

Figure 4:
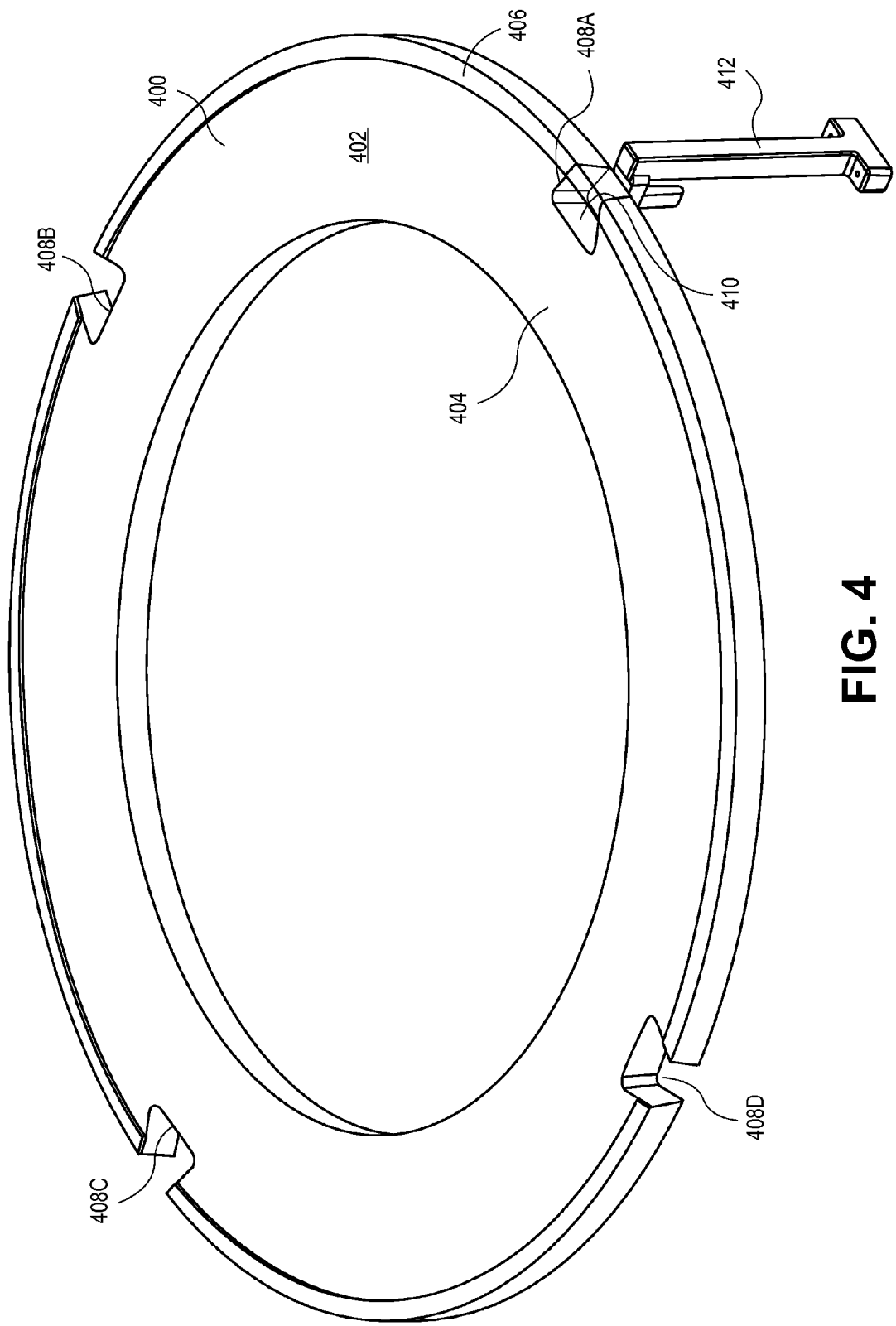
FIG. 4 illustrates an angled view of a capture single ring and one corresponding capture lift arm and captured lift plate portion for a tape frame lift, in accordance with an embodiment of the present invention.

FIG. 4 illustrates an angled view of a capture single ring and one corresponding capture lift arm and captured lift plate portion for a tape frame lift, in accordance with an embodiment of the present invention. Referring to FIG. 4, a capture single ring 400 has an upper surface 402 for supporting a tape frame that supports a wafer or substrate. In one embodiment, a portion 404 of the upper surface 402 for making contact with the tape frame is recessed below a raised perimeter edge 406, as is depicted in FIG. 4. In one embodiment, the capture single ring includes four locations 408 for capture, i.e., locations 408A, 408B, 408C, and 408D. It is to be appreciated that less or more than four locations for capture may actually be included in the capture single ring 400. In one embodiment, each location 408 is a three-sided, tapered pocket. As exemplified at location 408A, each three-sided, tapered pocket accommodates a captured lift plate portion 410 which is coupled to a capture lift arm 412.

Figure 5:
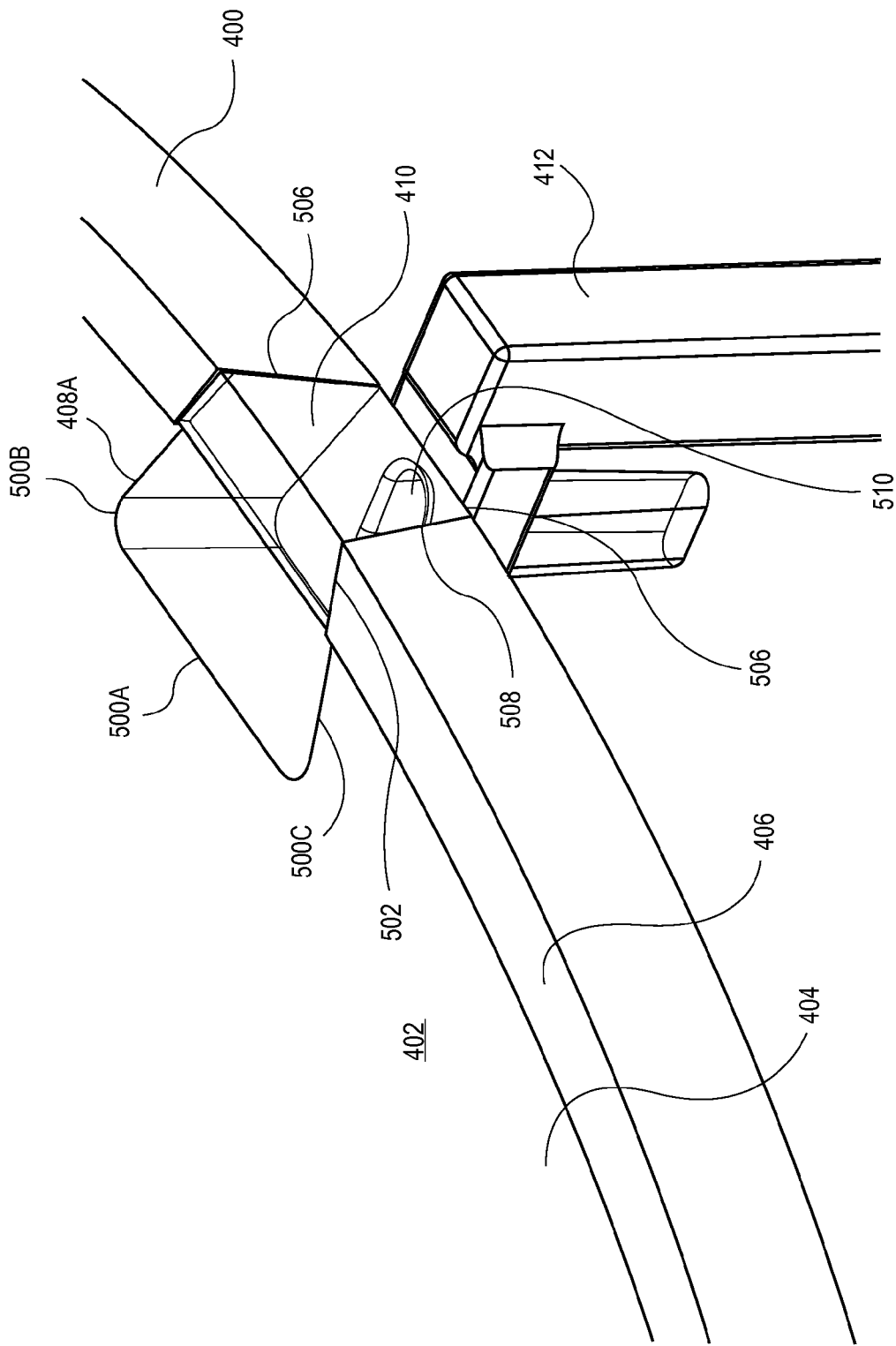
FIG. 5 illustrates a magnified view of the location for capture of the capture single ring of FIG. 4, in accordance with an embodiment of the present invention.

FIG. 5 illustrates is a magnified view of the location 408A for capture of the capture single ring 400 of FIG. 4, in accordance with an embodiment of the present invention. Referring to FIG. 5, the portion 404 and the raised perimeter edge 406 of the upper surface 402 of the capture single ring 400 are shown. Also shown are the capture location 408A, the captured lift plate portion 410 and the capture lift arm 412. The three-sided, tapered pocket of the location 408A has a main side 500A and two secondary sides 500B and 500C which together taper inwardly from the main side 500A towards the raised perimeter edge 406. In a vertical direction, in one embodiment, the three-sided, tapered pocket of the location 408A further tapers inward from the upper surface 502 to the lower surface 504 of the three-sided, tapered pocket of the location 408A, i.e., along sidewalls 506 of the three-sided, tapered pocket of the location 408A, as is depicted in FIG. 5. In an embodiment, the arrangement shown provides a self-aligning, three-sided tapered face-to-tapered face mating arrangement for capturing the capture single ring 400. In one such embodiment, the arrangement provides the ability to limit rotation with respect to an underlying ESC. In a specific embodiment, main side 500 is approximately 1 inch long, while secondary sides 500B and 500C are each approximately ⅜ths of an inch in length. As can also be viewed in FIG. 5, in an embodiment, the capture lift arm 412 includes a compliant alignment hole 510, suitable for attaching and detaching from the captured lift plate portion 410.

Figure 6:
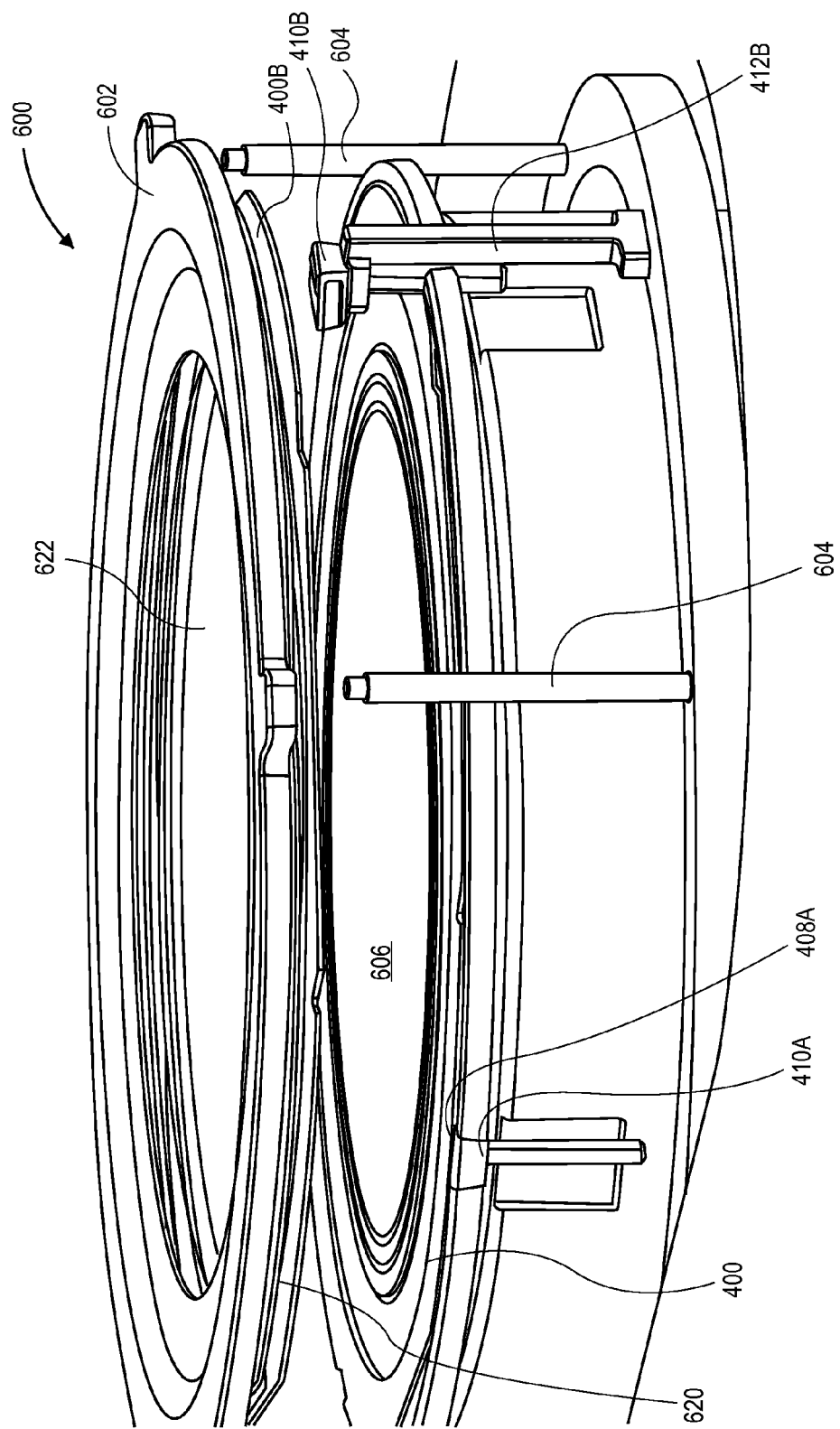
FIG. 6 illustrates a slightly angled view of a shadow ring assembly including the capture single ring assembly of FIGS. 4 and 5, in accordance with an embodiment of the present invention.

FIG. 6 illustrates a slightly angled view of a shadow ring assembly including the capture single ring assembly of FIGS. 4 and 5, in accordance with an embodiment of the present invention. Referring to FIG. 6, a shadow ring assembly 600 includes a shadow ring 602 and one or more shadow ring posts 604. The capture single ring 400 is shown surrounding an ESC cathode 606. Depicting a down position, a captured lift plate portion 410A is shown coupled with the capture location 408A of the capture single ring 400. For reference, a capture lift arm 412B and corresponding captured lift plate portion 410B are shown as raised, e.g., as in a lifting position (a corresponding second position 400B for a captured single ring is also depicted to aid the example). It is to be appreciated, however, that only a single position (e.g., down or lifting position) is achievable at any given time. Also depicted in FIG. 6, in order to provide a perspective of sizing, is a tape frame 620 and corresponding substrate or wafer 622. Other aspects of the shadow ring assembly, such as a lift ring, are described in greater detail below in association with the exemplary shadow ring of FIG. 11.

In an embodiment, a lift operation involves a hand-off. In the hand-off, the shadow ring lifts off, the capture lift arms seat to captured lift plates from the capture single ring, the capture lift plates pick up the tape frame from the capture single ring and lifts to hand-off. A process operation involves the capture lift plates seating into the capture single ring and tape frame on the capture single ring. The capture lift plates unseat from the capture lift arms. The shadow ring lowers for processing.

Figure 7:
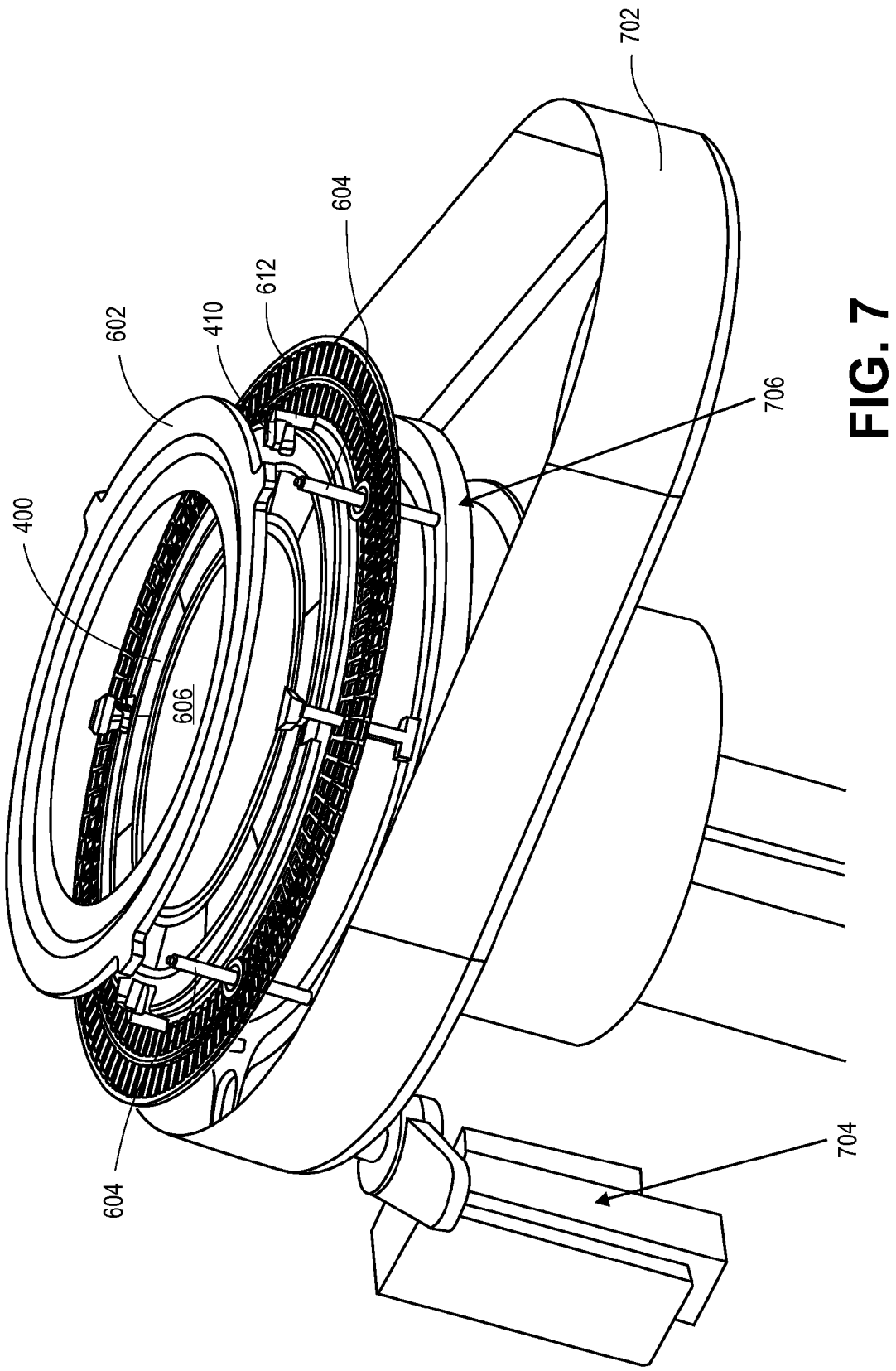
FIG. 7 illustrates an angled view of the shadow ring assembly of FIG. 6 situated with corresponding single lift assembly and casing, in accordance with an embodiment of the present invention.

FIG. 7 illustrates an angled view of the shadow ring assembly of FIG. 6 situated with corresponding single lift assembly and casing, in accordance with an embodiment of the present invention. Referring to FIG. 7, the shadow ring 602 and shadow ring posts 604 are shown. The capture single ring 400, captured lift plate portions 410 and capture lift arms 412 are also shown as positioned around the ESC cathode 606. The shadow ring assembly is housed in a casing 702. Outside of the casing 702, a single lift assembly 704 is included and, in an embodiment, is coupled to a single lift hoop 706. An exemplary single lift hoop for a tape frame and shadow ring is described in greater detail below in association with FIG. 11.

Figure 8:
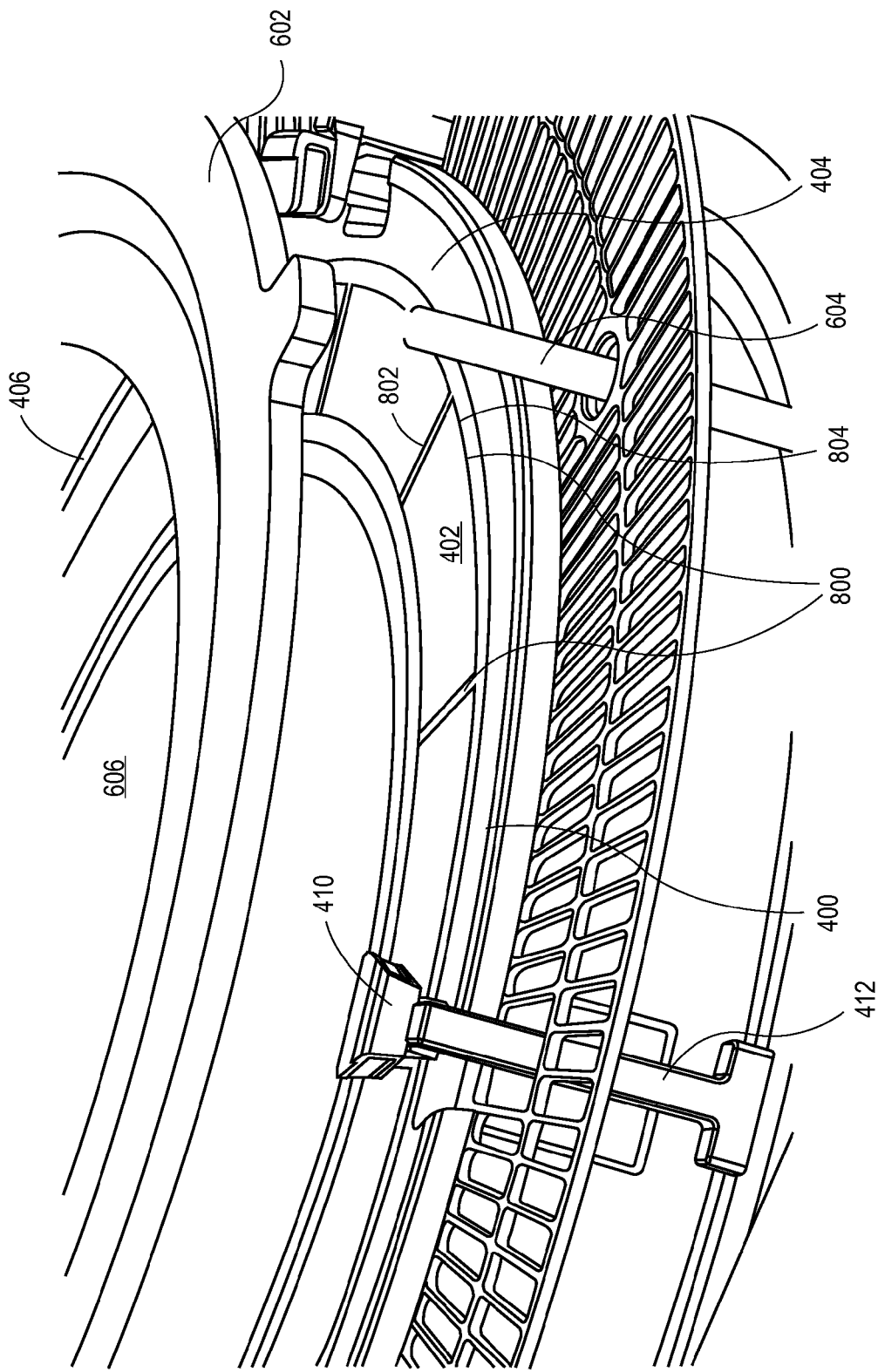
FIG. 8 illustrates a magnified view of the shadow ring assembly of FIG. 7, highlighting helium cooling channels in the upper surface of the capture single ring of the tape frame lift, in accordance with an embodiment of the present invention.

FIG. 8 illustrates a magnified view of the shadow ring assembly of FIG. 7, highlighting helium cooling channels in the upper surface of the capture single ring of the tape frame lift, in accordance with an embodiment of the present invention. Referring to FIG. 8, the capture single ring 400 of a tape frame lift is shown as situated surrounding the ESC cathode 606, below the shadow ring 602, and within perimeters of the shadow ring posts 604 and capture lift arms 412 and corresponding captured lift plate portions 410. The upper surface 402 of the capture single ring 400 is shown, including the portion 404 of the upper surface 402 for making contact with the tape and the raised perimeter edge 406. Furthermore, in accordance with an embodiment of the present invention, cooling channels 800 are shown as scribed into the upper surface 402 of the capture single ring 400. In an embodiment, the cooling channels are included to permit flow of a cooling fluid along the surface of the capture single ring 400, directly below a supported tape frame. In one such embodiment, the cooling channels 800 are for flowing helium gas as a coolant along the surface 402 of the capture single ring 400. In a particular embodiment, as oriented with respect to a center of the capture single ring 400, both radial 802 and circumferential 804 cooling channels 800 are included, as is depicted in FIG. 8.

Figure 9:
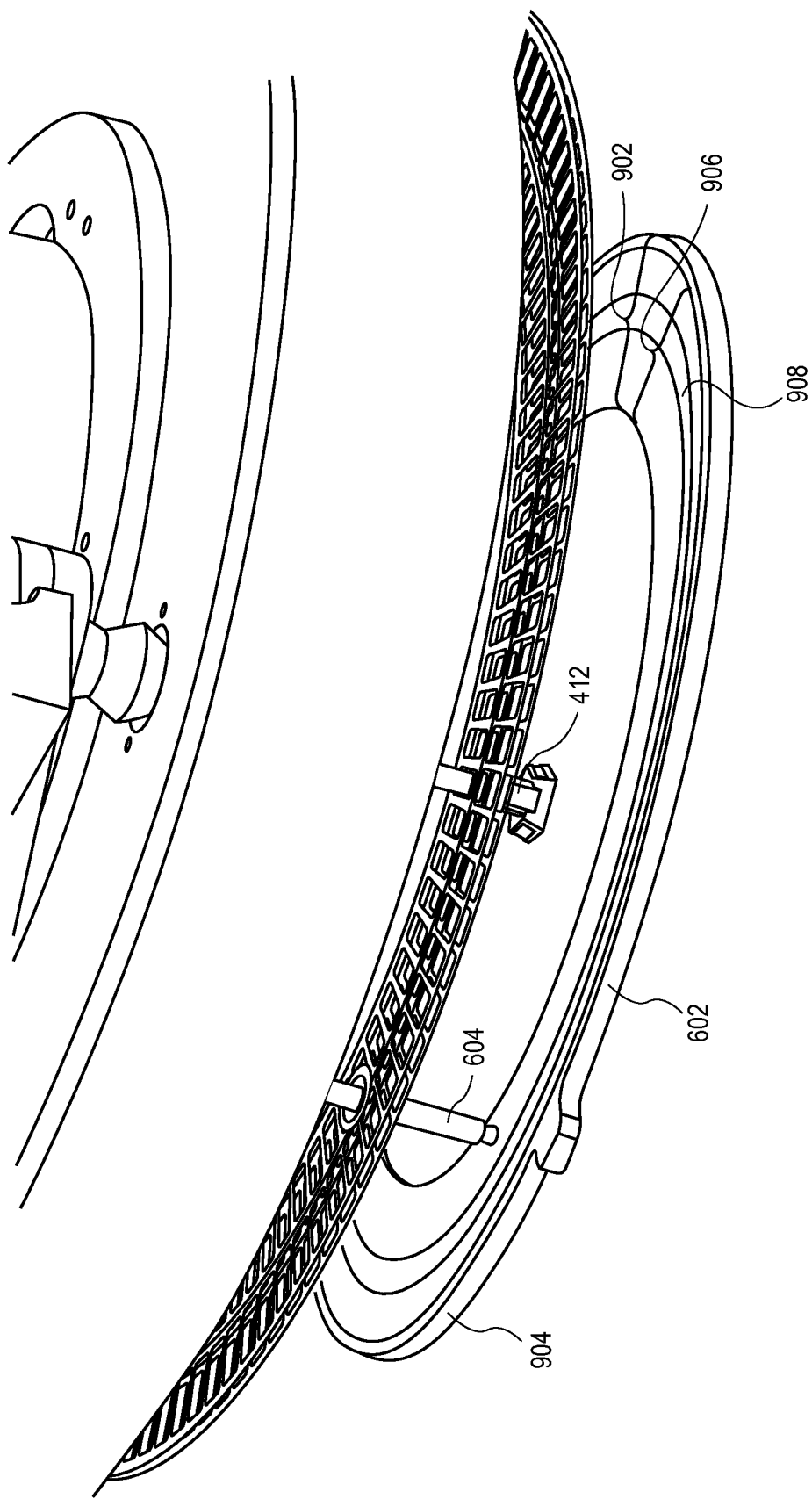
FIG. 9 illustrates an angled view of the bottom surface of a low contact shadow ring, in accordance with an embodiment of the present invention.

In one aspect, the shadow ring 602 is a low contact shadow ring. For example, FIG. 9 illustrates an angled view of the bottom surface of a low contact shadow ring, in accordance with an embodiment of the present invention. Referring to FIG. 9, the shadow ring 602 of FIG. 8 is shown from a bottom up perspective such that the bottom surface 902 of the shadow ring 602 can be seen. For orientation purposes, a shadow ring post 604 and a capture lift arm 412 are also shown. The bottom surface 902 of the shadow ring 602 has a raised perimeter edge 904 surrounding a contact surface 906. In one embodiment, the raised perimeter edge 904 of the shadow ring 602 compliments, e.g., can be aligned to rest together with the raised perimeter edge 406 of the capture single ring 400. The edges 904 and 406 are non-contact surfaces since a tape frame sits within these perimeters. In one embodiment, the contact surface 906 of the bottom surface 902 of the shadow ring includes a recessed surface feature 908 therein. In one such embodiment, the recessed surface feature 908 is an annular recess, as is depicted in FIG. 9. In a particular such embodiment, recessed surface feature 908 is sized and positioned to allow contact of the shadow ring 602 on four perimeter surfaces of the tape frame, or about 25% of the tape frame area.

In accordance with one or more embodiments, and applicable to one or more of the embodiments described in association with FIGS. 4-9, a singular lift mechanism may include a motorized or pnuematic drive and a common lifting ring. The singular drive assembly vertically positions both a tape frame lift and a shadow ring, and requires both to work in tandem. The tape frame lift includes a helium-cooled single ring, approximately four tape frame lift plates and associated lift plate arms. The helium-cooled single ring has several primary design features. A first feature is four tapered pockets located at the edge of the single ring. The four tape frame lift plates have complimentary profiles to these tapered pockets. The complimentary feature does not allow plasma to contact the backside of the tape frame and directly heat the tape frame. A second feature is a raised perimeter rim on the single ring. There is a complimentary raised perimeter rim on the shadow ring. The complimentary feature creates a wrap-around geometry and isolates the tape frame from plasma. A third feature is channeling on the top surface of the single ring. The channeling can include radial and annular (circumferential) features. The radial channels provide a path for helium to migrate from the edge of an electrostatic chuck to the annular (circumferential) channel. The annular (circumferential) channel is located under the tape on the tape frame and under the tape frame itself. The helium is a heat transfer medium to dissipate heat to the cooler single ring below. The tape and tape frame are shielded from the plasma by the shadow ring.

In accordance with an embodiment of the present invention, a lift design may require only one lift drive assembly for both the tape frame motion and the shadow ring motion. The tape and tape frame is thermally and plasma isolated as not to exceed the allowable temperature of the tape or adhesive. In one such embodiment, the design provides plasma thermal isolation approximately in the range of 20 degrees Celsius to 40 degrees Celsius, depending upon the actual plasma conditions. The single lift drive may be used for cost reduction and/or motion simplification. The physical design features of the single ring and shadow ring may be used for modifying edge temperature effects.

In another aspect of the present invention, one or more embodiments described herein are directed to an actively-cooled shadow ring for heat dissipation in a plasma etch chamber. Embodiments may include plasmas and plasma based processes, thermal management, active cooling, and heat dissipation. One or more embodiments described herein are directed to a plasma thermal shield for heat dissipation in a plasma chamber. Embodiments may include plasmas and plasma based processes, thermal management, shielding of plasma generated species, and heat dissipation. Applications for either of the actively-cooled shadow ring or the plasma thermal shield, or both, may include die singulation but other high power etch processes or differentiated etch chemistries may benefit from embodiments described herein. The plasma thermal shield may be used on its own as an inexpensive, passive component, or it may be combined with an actively-cooled shadow ring as a thermal shield to modify plasma conditions. In the latter case, the plasma thermal shield is effectively used as a dopant source in a plasma etch process. In accordance with an embodiment of the present invention, a cooled tape frame lift is implemented along with an actively-cooled shadow ring or a plasma thermal shield, or both, during a plasma etch process.

For example, in an embodiment, the assembly including a wafer or substrate on the substrate carrier is subjected to a plasma etch reactor without affecting (e.g., etching) the film frame (e.g., tape ring 304) and the film (e.g., backing tape 302). In one such embodiment, an actively-cooled shadow ring or a plasma thermal shield, or both, are implemented during the etch portion of the dicing process. In an example, FIG. 10 illustrates the substrate carrier of FIG. 3 with an overlying actively-cooled shadow ring or a plasma thermal shield, or both, and with an underlying cooled tape frame lift, in accordance with an embodiment of the present invention.

Figure 10:
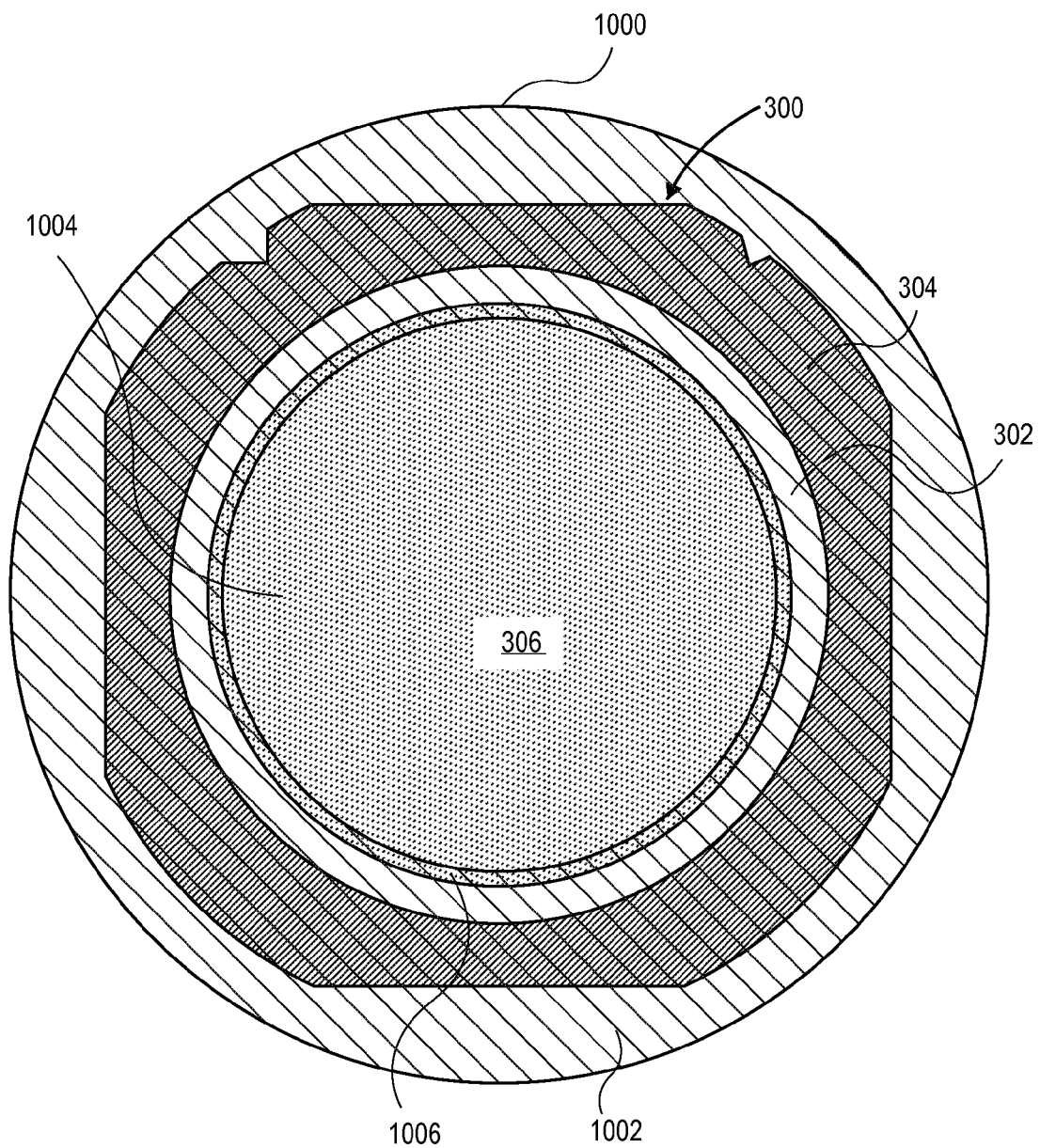
FIG. 10 illustrates the substrate carrier of FIG. 3 with an overlying actively-cooled shadow ring or a plasma thermal shield, or both, and with an underlying cooled tape frame lift, in accordance with another embodiment of the present invention.

Referring to FIG. 10, the substrate carrier 300, including the layer of backing tape 302 and tape ring or frame 304 is covered, in a top view perspective, by an actively-cooled shadow ring or a plasma thermal shield, or both, (all options represented as 1000 in FIG. 10). The actively-cooled shadow ring or a plasma thermal shield, or both, 1000 includes a ring portion 1002 and inner opening 1004. In one embodiment, a portion of the supported wafer or substrate 306 is also covered by the actively-cooled shadow ring or a plasma thermal shield, or both, 1000 (specifically, portion 1006 of the actively-cooled shadow ring or a plasma thermal shield, or both, 1000 covers a portion of the wafer or substrate 1006). In a specific such embodiment, the portion 1006 of the actively-cooled shadow ring or a plasma thermal shield, or both, 1000 covers approximately 1-1.5 mm of the outer most portion of the wafer or substrate 306. The portion covered may be referred to as the exclusion region of the wafer or substrate 306 since this area is effectively shielded from a plasma process. In one embodiment, the substrate carrier is supported on a cooled tape frame lift (not shown), while covered with the actively-cooled shadow ring or a plasma thermal shield, or both.

In a first such aspect, an exemplary actively-cooled shadow ring for heat dissipation in a plasma chamber, which may be used as described with or may be modified to accommodate cooled tape frame lift, is now described in greater detail. In an embodiment, an actively-cooled shadow ring can be implemented to reduce a temperature of a process kit shadow ring during processing of a wafer supported by a wafer carrier. By reducing the temperature of a shadow ring, damage or burning of a die singulation tape that otherwise occurs at elevated temperatures may be mitigated. For example, a damaged or burned die singulation tape normally leads to the wafer or substrate as not being recoverable. Furthermore, the attached tape can become damaged when the tape frame reaches an elevated temperature. Although described herein in the context of tape and frame protection during etch processing for die singulation, use of an actively-cooled shadow ring can provide other process benefits can include an increase in throughput. For example, temperature reduction may otherwise be achieved by easing of process conditions such as RF power reduction, but this requires an increase in process time which is detrimental to throughput.

Figure 11:
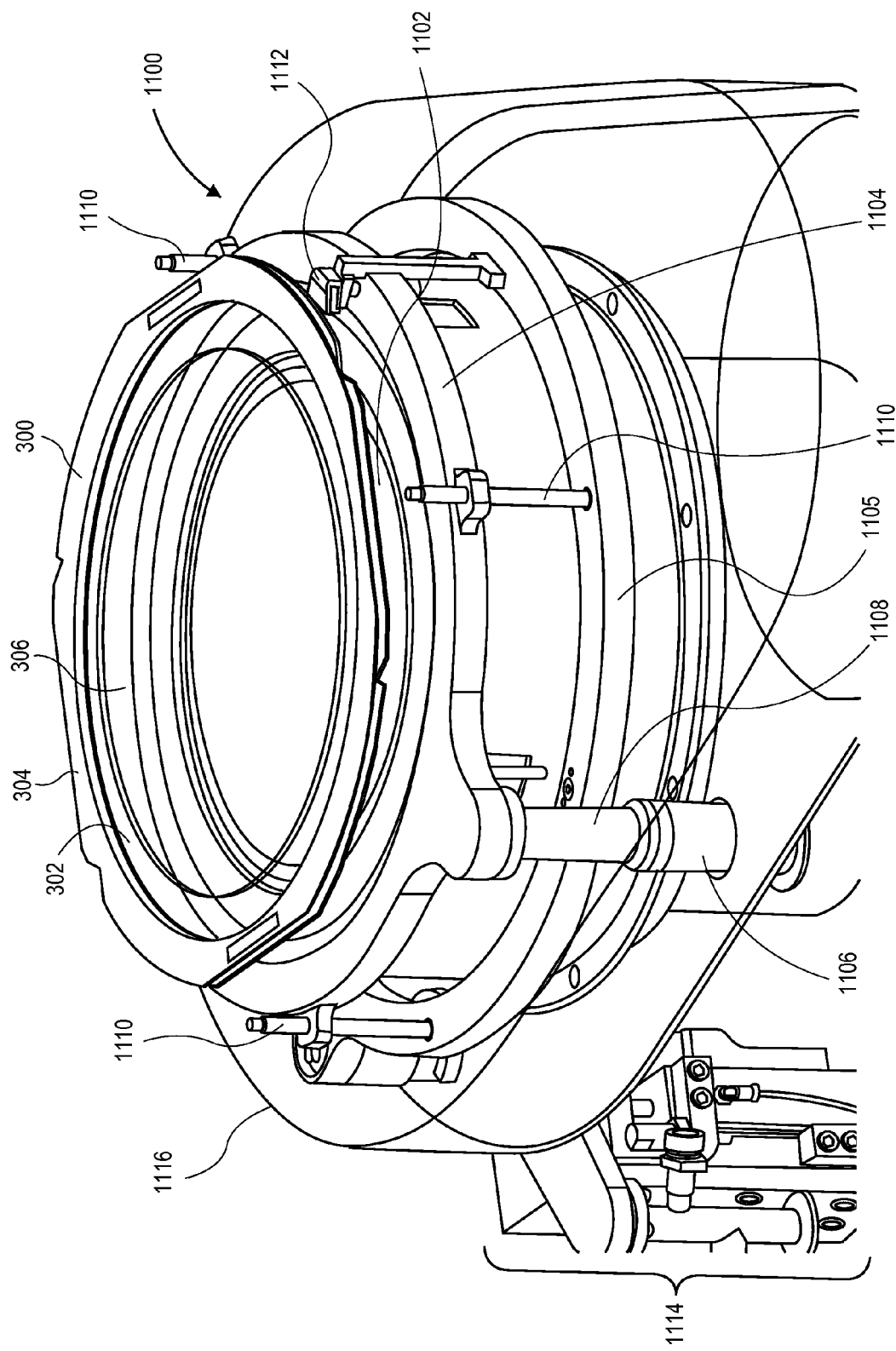
FIG. 11 illustrates an angled view of an actively-cooled shadow ring for heat dissipation in a plasma chamber with relative positioning to an etch cathode shown and relative sizing to a wafer support shown, in accordance with an embodiment of the present invention.

FIG. 11 illustrates an angled view of an actively-cooled shadow ring for heat dissipation in a plasma chamber with relative positioning to an etch cathode shown and relative sizing to a wafer support shown, in accordance with an embodiment of the present invention.

Referring to FIG. 11, a support apparatus 1100 for a plasma chamber includes a cathode 1102 positioned below an actively-cooled shadow ring 1104. A wafer or substrate support 300 with a tape 302 and frame 304 and supporting a wafer of substrate 306 is shown above the actively-cooled shadow ring 1104 for sizing perspective. Such a wafer or substrate support can be as described above with respect to FIG. 3. In use, the wafer or substrate support 300 is actually position between the actively-cooled shadow ring 1104 and the cathode 1102. The support apparatus 1100 may also include a motorized assembly 1114 and a casing 1116, which is also depicted in FIG. 11.

Referring again to FIG. 11, the actively-cooled shadow ring 1104 is fed with coolant gas or liquid by a bellows feed-through 1106 which feeds into a plasma exposed coupler 1108. In an embodiment, the actively-cooled shadow ring 1104 is raised or lowered relative to a fixed cathode by three vertical posts 1110 which can be raised for introduction of the substrate or wafer carrier 300 to the cathode 1102 and then lowered to clamp the substrate or wafer carrier 300 into position. The three vertical posts 1110 attach the actively-cooled shadow ring 1104 to a circular ring 1105 below. The circular ring 1105 is connected to the motorized assembly 1114 and provides the vertical motion and positioning of the actively-cooled shadow ring 1104.

The substrate or wafer carrier 300 may rest on a plurality of pads that sit between the actively-cooled shadow ring 1104 and the cathode 1102. For illustrative purposes, one such pad 1112 is depicted. However, it is to be appreciated that the pad 1112 is actually below or underneath the actively-cooled shadow ring 1104, and that more than one pad is typically used, such as four pads. In an embodiment, the actively-cooled shadow ring 1104 is composed of aluminum with a hard anodized surface or a ceramic coating. In an embodiment, the actively-cooled shadow ring 1104 is sized to entirely cover, from a top-down perspective, the tape frame 304, the tape 302, and the outer most region of the substrate 306 during plasma processing, as was described in association with FIG. 10. In one specific such embodiment, the leading edge of the shadow ring to the wafer is approximately 0.050 inches high.

In an embodiment, the cathode 1102 is an etch cathode and can function as an electrostatic chuck to assist in sample clamping during processing. In one embodiment, the cathode 1102 is thermally controlled.

Figure 12:
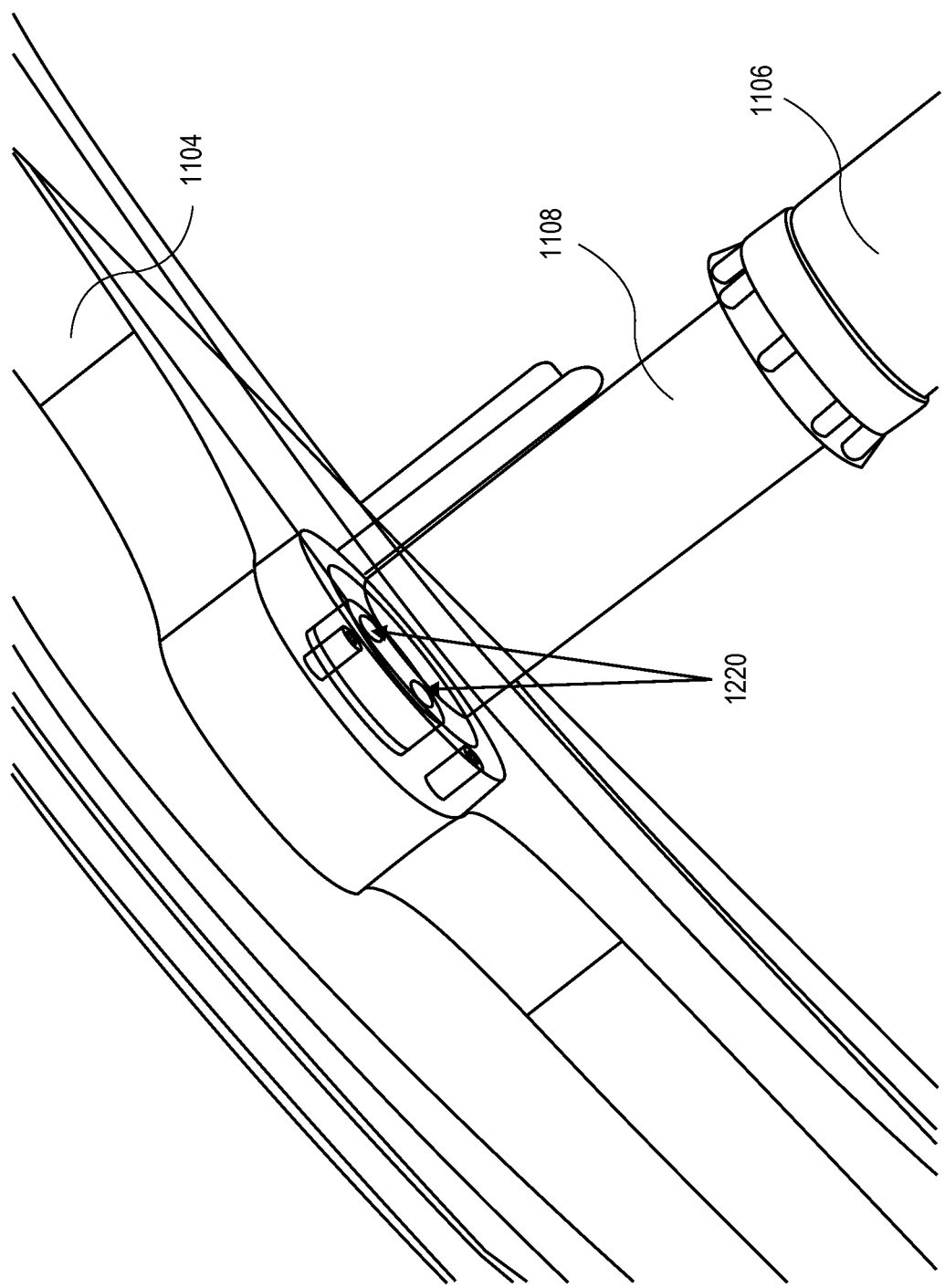
FIG. 12 illustrates an enlarged view of the plasma exposed coupler of the support apparatus of FIG. 11, in accordance with an embodiment of the present invention.

FIG. 12 illustrates an enlarged view of the plasma exposed coupler 1108 of the support apparatus 1100 of FIG. 11, in accordance with an embodiment of the present invention. Referring to FIG. 12, the terminating end of the bellows feed-through is depicted as coupled to the plasma exposed coupler 1108. A pair of fluid connections 1220, such as a supply and return line pair, is shown as entering/exiting the actively-cooled shadow ring 1104. The plasma exposed coupler 1108 is depicted as essentially transparent in order to reveal the pair of fluid connections 1220 for illustrative purposes. In an embodiment, the pair of fluid connections 1220 provides an entrance/exit to an internal fluid channel that circulates through the actively-cooled shadow ring 1104. In one such embodiment, the pair of fluid connections 1220 enables continual flow of a cooling fluid or gas through the actively-cooled shadow ring during plasma processing. In a specific embodiment, the cooling channels travel essentially the entire mid-circumference of the body of an annular actively-cooled shadow ring.

In an embodiment, the ability to enable such continual flow can provide superior temperature control of the shadow ring which enables temperature control (e.g., reduced temperature exposure) of the tape frame and tape of a substrate carrier clamped to the actively-cooled shadow ring 1104. This protection of the tape frame and tape is in addition to the protection provided by physically blocking the plasma from reaching the tape frame and tape of the substrate or wafer carrier. The fluid-channeled shadow ring, referred to herein as actively-cooled shadow ring 1104, is distinguished from passively cooled shadow rings that may merely be cooled by contact with a heat sink or w cooled chamber wall.

Referring again to FIG. 12, in an embodiment, the plasma exposed coupler 1108 is a fixed-length connection between the actively-cooled shadow ring 1104 above and the bellows feed-through 1106 below. The coupling provided is intended to be exposed to a plasma process and to allow the bellows feed-through 1106 to be positioned away from the plasma process. In one such embodiment, the coupling is a vacuum connection between the bellows feed-through 1106 and the actively-cooled shadow ring 1104.

Figure 13:
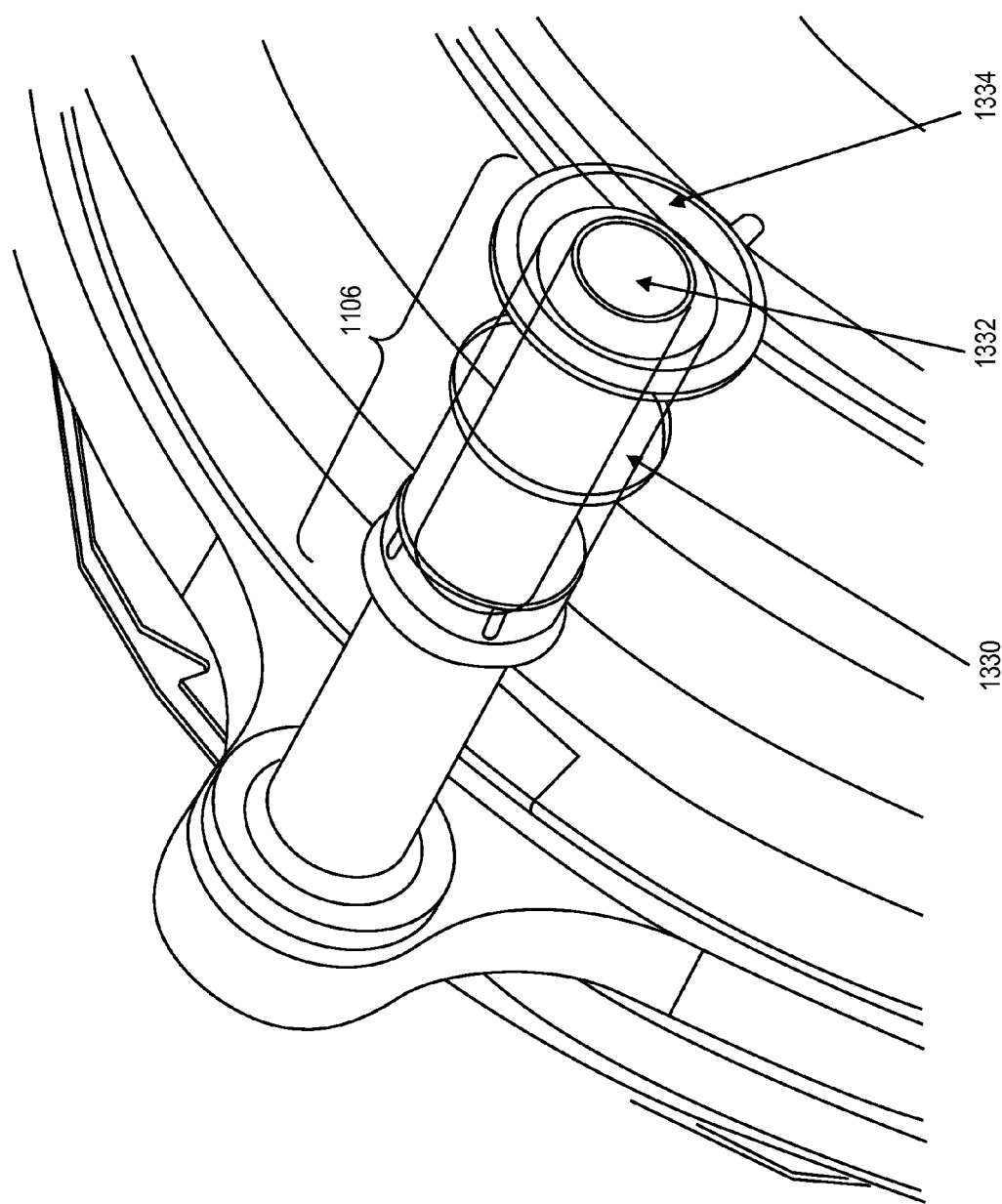
FIG. 13 illustrates an enlarged view of the bellows feed-through of the support apparatus of FIG. 11, in accordance with an embodiment of the present invention.

FIG. 13 illustrates an enlarged view of the bellows feed-through 1106 of the support apparatus 1100 of FIG. 11, in accordance with an embodiment of the present invention. Referring to FIG. 13, the bellow feed-through 1106 is shown having an outer bellows 1330 with an inner sleeve 1332. A connection 1334 is provided for coupling to a chamber body. The lower opening of the bellows feed-through 1106 can accommodate supply and return lines for the coolant used to cool actively-cooled shadow ring 1104. In one embodiment, the outer bellows 1330 is metallic, the inner sleeve 1332 is a stainless steel protective sleeve to accommodate hoses for supply and return lines, the sizing of connection 1334 is an NW40 connection.

In an embodiment, the bellows feed-through 1106 allows vertical motion of the actively-cooled shadow ring 1104, which is in vacuum. This motion is provided by a motorized assembly which provides the necessary vertical positioning. The bellows feed-through must have allowance for this range of motion. In one embodiment, the bellows feed-through 1106 has a vacuum connection at either end, e.g., a vacuum centering o-ring seal at one end and an o-ring seal on the other end. In one embodiment, the inner portion of the bellows feed-through 1106 has a protective shield to allow fluid lines to pass-through without compromising the convolutions. Together, the bellows feed-through 1106 and the plasma exposed coupler 1108 provide a path for the supply and return lines for a coolant fluid. The coolant fluid may be passed through a fluid chiller (not depicted) after exiting and/or before entering the actively-cooled shadow ring 1104.

In an embodiment, the actively-cooled shadow ring 1104 is capable of dissipating a large quantity of plasma heat and in a short period of time. In one such embodiment, the actively-cooled shadow ring 1104 is designed to be capable of reducing a shadow ring from temperatures greater than 260 degrees Celsius to less than 120 degrees Celsius on a continuous processing basis. In an embodiment, with a vacuum-to-atmosphere connection available, an internal plasma-exposed component could be cooled and/or vertically-moved in a chamber.

Thus, in an embodiment, an actively-cooled shadow ring assembly includes the following major components: a bellows feed-through, a plasma-exposed coupling, a fluid-channeled shadow ring, fluid supply and return lines, and a fluid chiller. The actively-cooled shadow ring may also have a plasma shield as a plasma protective cover over the actively-cooled shadow ring, such as described in association with FIGS. 14 and 15 below. The actively-cooled shadow ring has an internal fluid channel to allow a chilled fluid to flow and remove plasma-induced heat. With respect to sizing, an actively-cooled shadow ring may have an increased thickness on the order of about $1/8^{th}$ of an inch relative to a conventional shadow ring in order to accommodate the cooling channels. In an embodiment, the fluid channel is designed such that it removes this heat before the actively-cooled shadow ring develops a temperature that will damage the tape or greatly elevate the temperature of the tape frame of a wafer or substrate carrier. In one embodiment, the fluid itself is non-RF conductive so as not to draw RF power away from the plasma or RF power to the chiller. In one embodiment, the actively-cooled shadow ring is capable of withstanding high RF power and not suffer plasma erosion. The supply and return fluid lines are connected to the actively-cooled shadow ring and run inside the plasma-exposed coupler and bellows feed-through. In one embodiment, the fluid lines are non-RF conductive and are capable of handling fluid temperatures below 0 degrees Celsius. In one embodiment, an associated chiller is capable of supplying a fluid below 0 degrees Celsius and with enough volume capacity to quickly dissipate the plasma heat developed.

In an embodiment, an actively-cooled shadow ring assembly is designed such that no fluid leaks or spills can be introduced into a process chamber housing the assembly. The actively-cooled shadow ring is removable for assembly and servicing. Components or kits may be grouped as: (1) an NW40 sized bellows with inner shield which includes a vacuum feed-through and inner shield for fluid lines, (2) a plasma-exposed coupler which can be a swap kit part, if necessary, (3) an actively-cooled shadow ring with an aluminum-core and anodized or ceramic coating, (4) low temperature fluid lines including a one-piece fluid connection line. Additional hardware may include a secondary chiller specifically designed for the actively-cooled shadow ring.

In a second such aspect, an exemplary plasma thermal shield for heat dissipation in a plasma chamber, which may be used as described with or may be modified to accommodate cooled tape frame lift, is now described in greater detail. The plasma thermal shield can be used with a standard shadow ring as an inexpensive, passive component for thermal protection of substrate carrier that is plasma etched using a conventional shadow ring. On the other hand, the plasma thermal shield may be used together with the above described actively-cooled shadow ring.

As an example FIG. 14 illustrates an angled top view and angled bottom view of a plasma thermal shield, in accordance with an embodiment of the present invention.

Referring to the top view of FIG. 14, a plasma thermal shield 1400 is an annular ring with an inner opening 1401. In an embodiment, the plasma thermal shield 1400 is sized and shaped to be compatible with, e.g., by nesting upon a top surface of, a shadow ring included in a plasma processing chamber. For example, in one such embodiment, the surface of the plasma thermal shield 1400 shown in the top view is the surface exposed to a plasma during processing. The surface of the top view includes a first upper surface region 1402 which is raised above a second upper surface region 1404. The first and second upper surfaces 1402 and 1404, respectively, are coupled by a sloping region 1406.

Referring to the bottom view of FIG. 14, the plasma thermal shield 1400 has a bottom surface that is not exposed to a plasma during processing. The surface of the bottom view includes a first lower surface region 1412 which is below a second lower surface region 1414. The first and second lower surfaces 1412 and 1414, respectively, are coupled by a sloping region 1416. In general, from a high level view, in an embodiment, the bottom surface of the plasma thermal shield 1400 reciprocates the general topography of the upper surface. However, as described in association with FIG. 15, some regions of the bottom surface of the plasma thermal shield 1400 may be removed for heat dissipating applications.

Figure 15:
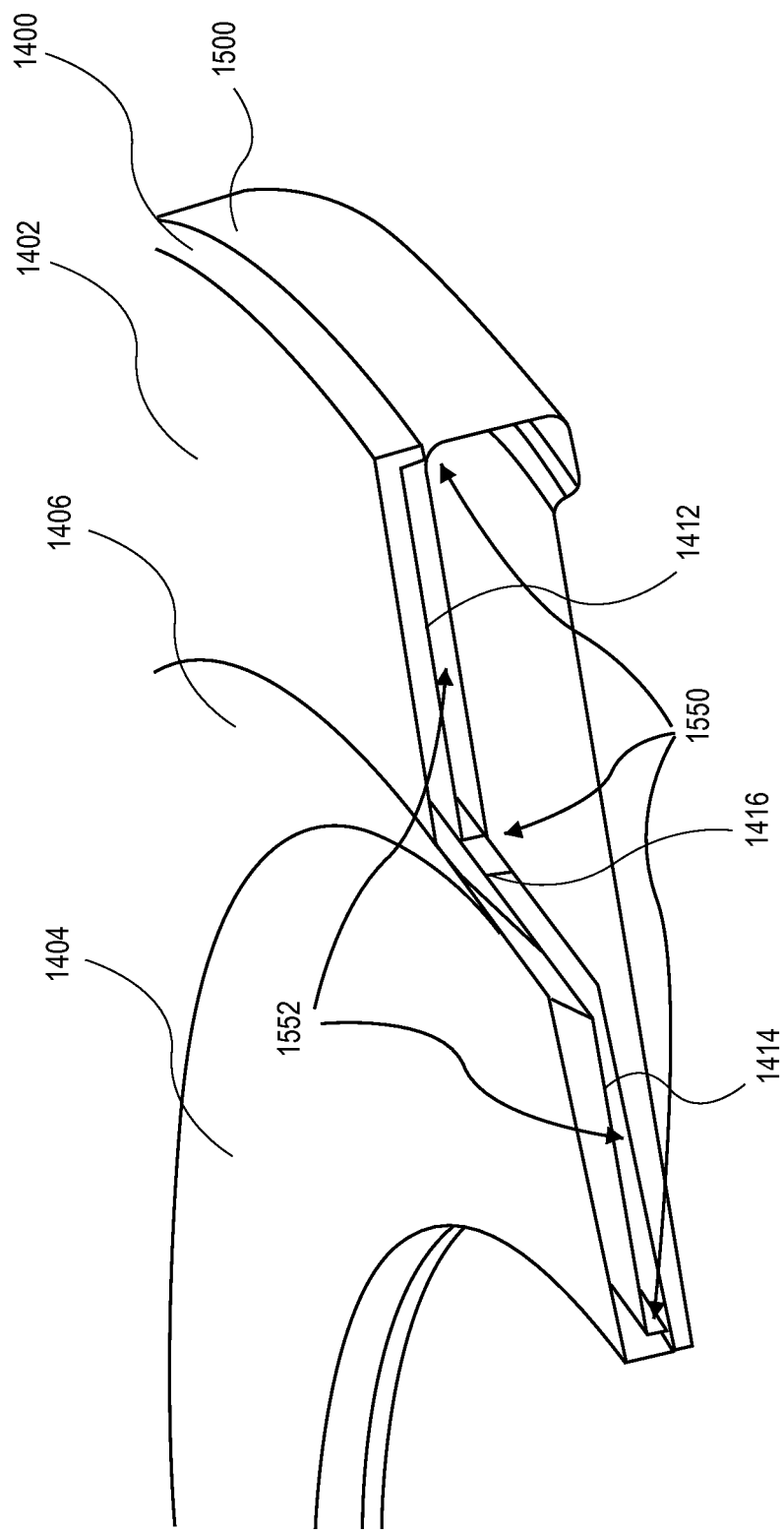
FIG. 15 illustrates an enlarged angled cross-sectional view of the plasma thermal shield of FIG. 14 as positioned on a top surface of a shadow ring, in accordance with an embodiment of the present invention.

FIG. 15 illustrates an enlarged angled cross-sectional view of the plasma thermal shield 1400 of FIG. 14 as positioned on a top surface of a shadow ring 1500, in accordance with an embodiment of the present invention.

Referring to FIG. 15, the plasma thermal shield 1400 is nested on an upper surface of a shadow ring 1500 (which, in an embodiment, is an actively-cooled shadow ring as described in association with FIGS. 11-13). The upper surface portions 1402, 1404 and 1406 are as described above with respect to FIG. 14. However, in the enlarged view of FIG. 15, it can be seen that the bottom surface portions 1412, 1414 and 1416 of the plasma thermal shield 1400 have recessed portions therein. In the particular example shown in FIG. 15, a first gap or cavity 1552 is formed between regions 1414 and 1416 of the bottom surface, and a second gap or cavity 1552 is formed between regions 1412 and 1416 of the bottom surface. The effect is to leave remaining three protruding portions or contact features 1550 that raise a majority of the bottom surface of the plasma thermal shield 1400 off of the top surface of the shadow ring 1500. In an embodiment, the three protruding portions or contact features 1550 run the entire annular length to provide nesting support for the plasma thermal shield 1400 when nested on the upper surface of the shadow ring 1500.

In an embodiment, the three protruding portions or contact features 1550 raise the majority of the bottom surface of the plasma thermal shield 1400 off of the top surface of the shadow ring 1500 by a height of approximately $1/16^{th}$ of an inch. Thus, first and second gaps or cavities 1552 have a height of approximately $1/16^{th}$ of an inch. In one such embodiment, the thinned regions of surfaces 1414 and 1412 have a remaining thickness of approximately $1/16^{th}$ of an inch. It is to be appreciated, however, that the size of the gaps or cavities 1552 (as a height dimension) provide a trade-off between distancing heat from an underlying shadow ring versus having sufficient material in the plasma thermal shield for absorbing heat. Thus, the height of the gaps can be varied by application. Furthermore, the extent and locations of the recessed portions between protruding or contact portions 1550 are subject to the same trade-off. In one embodiment, an amount of surface area of the bottom surface of the plasma thermal shield 1400 that is recessed is approximately in the range of 85-92%. In an embodiment, the plasma thermal shield 1400 is composed of a material such as, but not limited to, alumina ($Al_2O_3$), yttria ($Y_2O_3$), silicon nitride (SiN) or silicon carbide (SiC). In one embodiment, the plasma thermal shield 1400 is composed of a process sensitive material and can act as a source of dopant for a plasma process. In an embodiment, the plasma thermal shield 1400 can be viewed as an external device used to prevent contact of an underlying shadow ring with a hot surface or to act as a heat deflector for the underlying shadow ring.

In an embodiment, the plasma thermal shield 1400 and the shadow ring 1500 are installed as two separate components. In one embodiment, both the shadow ring 1500 surface and the plasma thermal shield 1400 barrier are composed of alumina, where the plasma thermal shield 1400 provides heat dissipation away from the surface of the shadow ring 1500 even though the materials are the same. In an embodiment, the plasma thermal shield 1400 blocks heat transfer to the shadow ring 1500 which is in contact with a tape frame of a substrate or wafer carrier. In an embodiment, with respect to power distribution, an open area of tape from the carrier may be positioned below the thinnest section of the shadow ring 1500. The consequential lowest mass region of the shadow ring 1500 is may be the highest in temperature. Accordingly, in an embodiment, the plasma thermal shield 1400 is designed to have greater mass and smaller gap in this region relative to the remainder of the plasma thermal shield 1400, i.e., greater proportional mass is added to the tape region of the carrier.

Thus, in an embodiment, a plasma thermal shield is cross-sectionally a shell of ceramic located on top of an existing shadow ring. In one embodiment, the material of the plasma thermal shield is the same material as the shadow ring and covers the entire top surface of the shadow ring. The top surface of the plasma thermal shield may or may not be conformal to the shadow ring below. In one embodiment, the top surface of a plasma thermal shield is a continuous surface and the underside has removed areas of material to reduce conduction to the shadow ring. In an embodiment, the contact points between a plasma thermal shield and shadow ring are related to prohibiting plasma into removed areas as well as installation alignment. It is to be appreciated that the removed area cannot be so great as to create a significant plasma in the removed areas. In the plasma environment, the heat generated by the plasma is transferred to the plasma thermal shield. The plasma thermal shield increase in temperature heats up and radiates the heat to the shadow ring below. However, the shadow ring is heated only by radiated energy from the plasma thermal shield and not by direct plasma contact.

In an embodiment, a plasma thermal shield is a single passive part. The shape and material of the plasma thermal shield can be modified for different process conditions. In an embodiment, the plasma thermal shield can be used to reduce the temperature of a shadow ring by a factor in the range of 100-120 degrees Celsius. The plasma thermal shield may also be used as a differentiated material cover for process chemistry modification, essentially providing a dopant source to the plasma process.

In an embodiment, a plasma thermal shield is used together with an actively-cooled shadow ring. Thus, possible assemblies described herein for protecting a substrate or wafer carrier during plasma processing include an actively-cooled shadow ring, a shadow ring having a plasma thermal shield thereon, or an actively-cooled shadow ring having a plasma thermal shield thereon. In all three scenarios, from a plan view perspective, a protective annular ring with exposing inner region is provided for plasma processing of the carrier.

In an aspect of the present invention, an etch reactor is configured to accommodate etching of a thin wafer or substrate supported by a substrate carrier. For example, FIG. 16 illustrates a cross-sectional view of an etch reactor, in accordance with an embodiment of the present invention.

Figure 16:
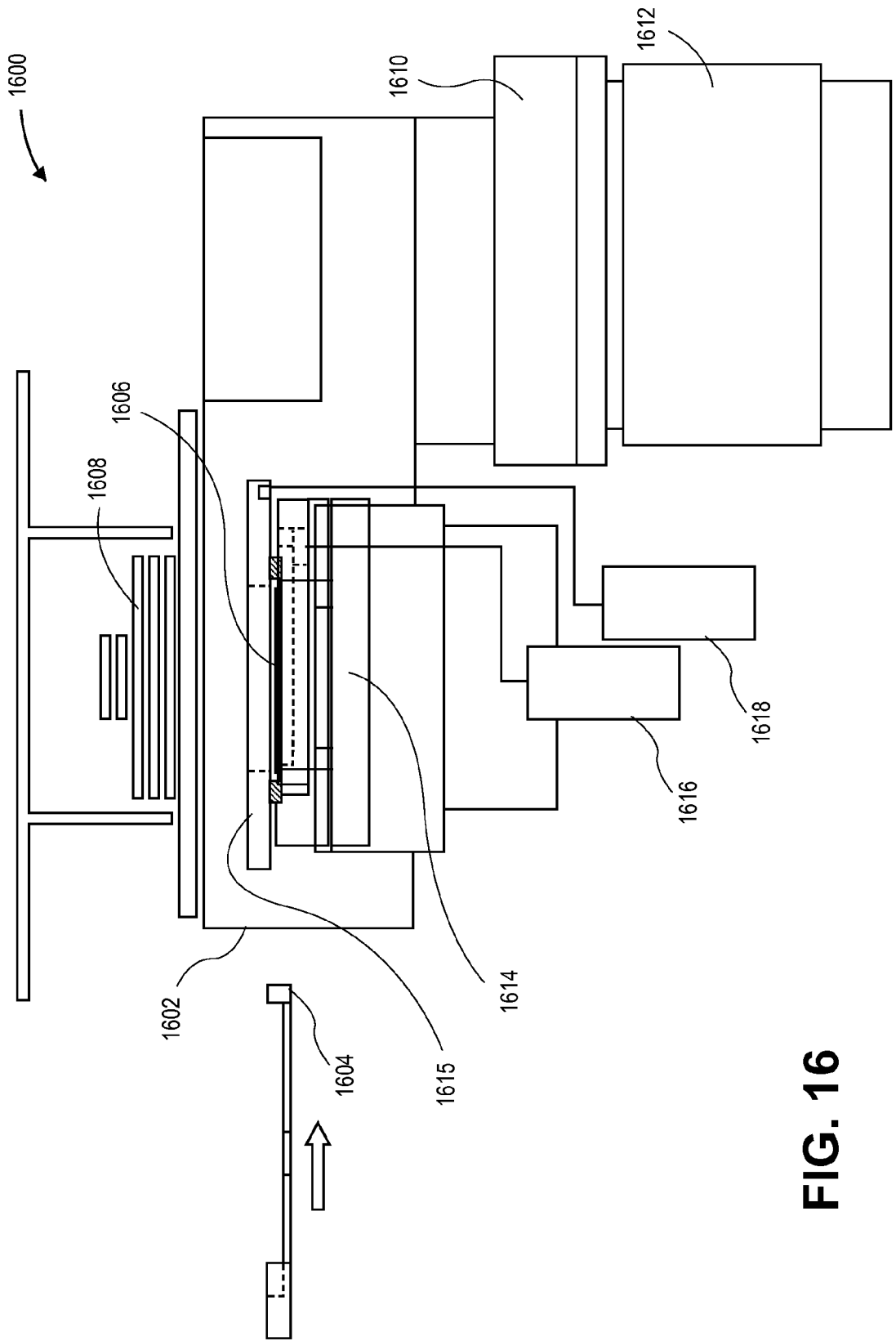
FIG. 16 illustrates a cross-sectional view of an etch reactor, in accordance with an embodiment of the present invention.

Referring to FIG. 16, an etch reactor 1600 includes a chamber 1602. An end effector 1604 is included for transferring a substrate carrier 1606 to and from chamber 1602. An inductively coupled plasma (ICP) source 1608 is positioned in an upper portion of the chamber 1602. The chamber 1602 is further equipped with a throttle valve 1610 and a turbo molecular pump 1612. The etch reactor 1600 also includes a cathode assembly 1614 (e.g., an assembly including an etch cathode or etch electrode). A shadow ring assembly 1615 is included above the region accommodating the substrate or wafer carrier 1606. In an embodiment, the shadow ring assembly 1615 includes a tape frame lift, such as a cooled tape frame lift. In an embodiment, the shadow ring assembly 1615 is one of an actively-cooled shadow ring, a shadow ring having a plasma thermal shield thereon, or an actively-cooled shadow ring having a plasma thermal shield thereon. A shadow ring actuator 1618 may be included for moving the shadow ring. In one such embodiment, the shadow ring actuator 1618 moves a single lift hoop that is coupled to a tape frame lift and a shadow ring. Other actuators, such as actuator 1616 may also be included.

In an embodiment, the end effector 1604 is a robot blade sized for handling a substrate carrier. In one such embodiment, the robotic end effector 1604 supports a film frame assembly (e.g., substrate carrier 300) during transfer to and from an etch reactor under sub-atmospheric pressure (vacuum). The end effector 1604 includes features to support the substrate carrier in the X-Y-Z axis with gravity-assist. The end effector 1604 also includes a feature to calibrate and center the end effector with respect to circular features of a processing tool (e.g., an etch cathode center, or a center of a circular silicon wafer).

In one embodiment, an etch electrode of the cathode assembly 1614 is configured to allow RF and thermal coupling with the substrate carrier to enable plasma etching. However, in an embodiment, the etch electrode only contacts a backing tape portion of a substrate carrier and not the frame of the substrate carrier.

In an embodiment, the shadow ring 1615 includes a protective annular ring, a lift hoop, and three supporting pins coupled between the lift hoop and the protective annular ring, as described in association with FIG. 11. The lift hoop is disposed in a processing volume radially outwards of a supporting assembly. The lift hoop is mounted on shaft in a substantially horizontal orientation. The shaft is driven by an actuator to move the lift hoop vertically in the processing volume. The three supporting pins extend upward from the lift hoop and position the protective annular ring above the supporting assembly. The three supporting pins may fixedly attach the protective annular ring to the lift hoop. The protective annular ring moves vertically with the lift hoop in the processing volume so that the protective annular ring can be positioned at a desired distance above a substrate and/or an exterior substrate handling device (such as a substrate carrier) can enter the processing volume between the protective annular ring and the supporting assembly to transfer the substrate. The three supporting pins may be positioned to allow the substrate carrier to be transferred in and out of a processing chamber between the supporting pins.

Figure 17:
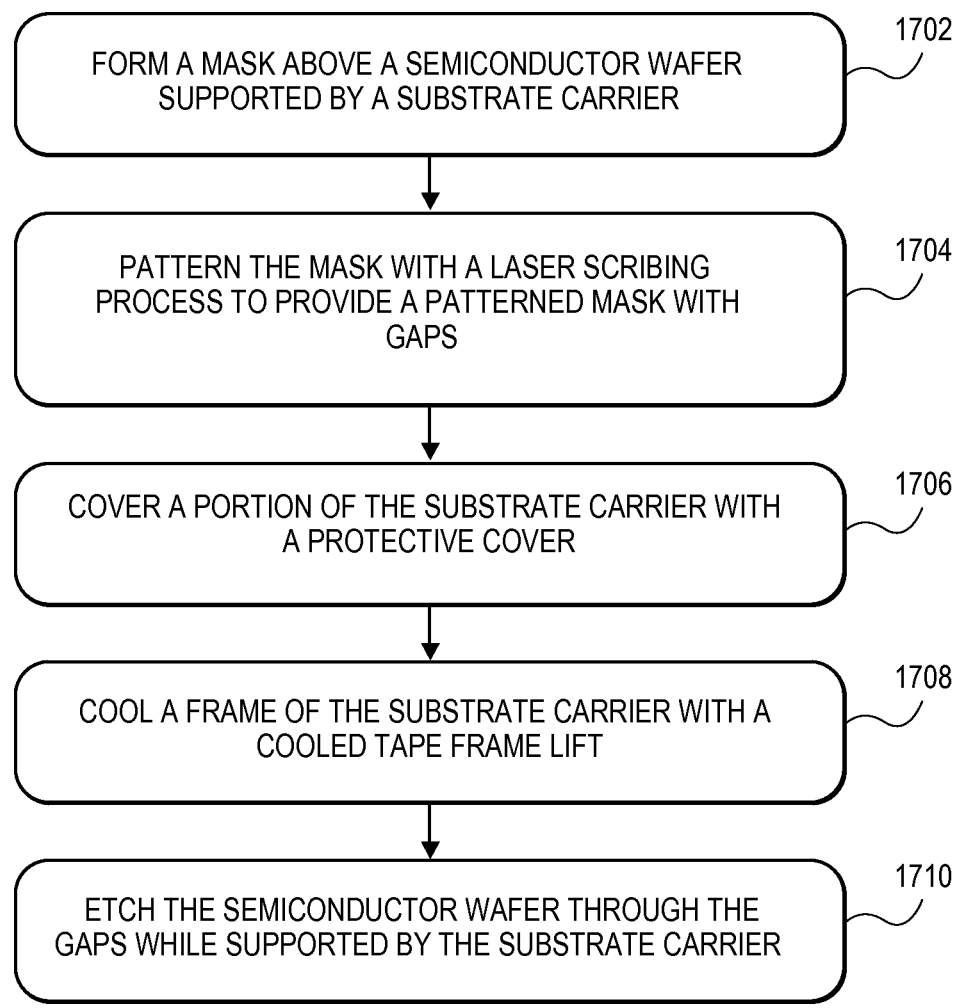
FIG. 17 is a Flowchart representing operations in a method of dicing a semiconductor wafer including a plurality of integrated circuits, in accordance with an embodiment of the present invention.
Figure 18A:
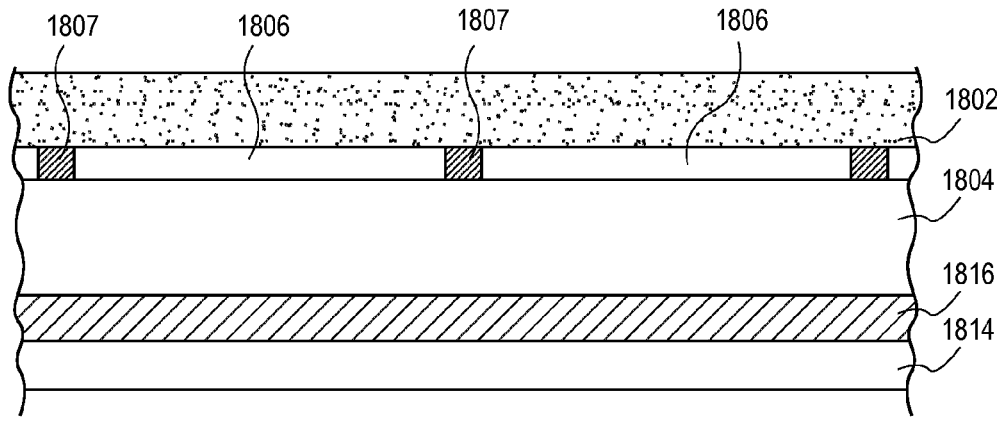
FIG. 18A illustrates a cross-sectional view of a semiconductor wafer including a plurality of integrated circuits during performing of a method of dicing the semiconductor wafer, corresponding to operation 1702 of the Flowchart of FIG. 17, in accordance with an embodiment of the present invention.
Figure 18B:
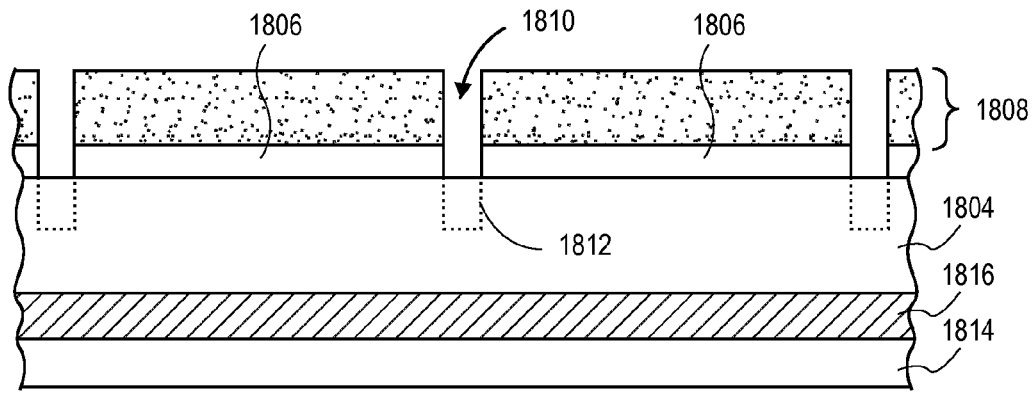
FIG. 18B illustrates a cross-sectional view of a semiconductor wafer including a plurality of integrated circuits during performing of a method of dicing the semiconductor wafer, corresponding to operation 1704 of the Flowchart of FIG. 17, in accordance with an embodiment of the present invention.
Figure 18C:
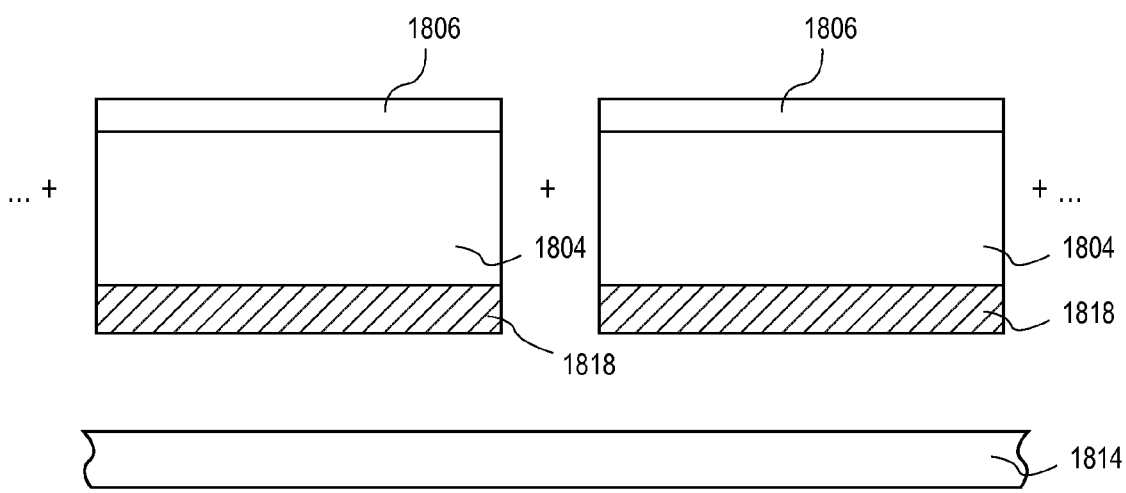
FIG. 18C illustrates a cross-sectional view of a semiconductor wafer including a plurality of integrated circuits during performing of a method of dicing the semiconductor wafer, corresponding to operation 1710 of the Flowchart of FIG. 17, in accordance with an embodiment of the present invention.

In another aspect, FIG. 17 is a Flowchart 1700 representing operations in a method of dicing a semiconductor wafer including a plurality of integrated circuits, in accordance with an embodiment of the present invention. FIGS. 18A-18C illustrate cross-sectional views of a semiconductor wafer including a plurality of integrated circuits during performing of a method of dicing the semiconductor wafer, corresponding to operations of Flowchart 1700, in accordance with an embodiment of the present invention.

Referring to operation 1702 of Flowchart 1700, and corresponding FIG. 18A, a mask 1802 is formed above a semiconductor wafer or substrate 1804. The mask 1802 is composed of a layer covering and protecting integrated circuits 1806 formed on the surface of semiconductor wafer 1804. The mask 1802 also covers intervening streets 1807 formed between each of the integrated circuits 1806. The semiconductor wafer or substrate 1804 is supported by a substrate carrier 1814.

In an embodiment, the substrate carrier 1814 includes a layer of backing tape, a portion of which is depicted as 1814 in FIG. 18A, surrounded by a tape ring or frame (not shown). In one such embodiment, the semiconductor wafer or substrate 1804 is disposed on a die attach film 1816 disposed on the substrate carrier 1814, as is depicted in FIG. 18A.

In accordance with an embodiment of the present invention, forming the mask 1802 includes forming a layer such as, but not limited to, a photo-resist layer or an I-line patterning layer. For example, a polymer layer such as a photo-resist layer may be composed of a material otherwise suitable for use in a lithographic process. In one embodiment, the photo-resist layer is composed of a positive photo-resist material such as, but not limited to, a 248 nanometer (nm) resist, a 193 nm resist, a 157 nm resist, an extreme ultra-violet (EUV) resist, or a phenolic resin matrix with a diazonaphthoquinone sensitizer. In another embodiment, the photo-resist layer is composed of a negative photo-resist material such as, but not limited to, poly-cis-isoprene and poly-vinyl-cinnamate.

In another embodiment, the mask 1802 is a water-soluble mask layer. In an embodiment, the water-soluble mask layer is readily dissolvable in an aqueous media. For example, in one embodiment, the water-soluble mask layer is composed of a material that is soluble in one or more of an alkaline solution, an acidic solution, or in deionized water. In an embodiment, the water-soluble mask layer maintains its water solubility upon exposure to a heating process, such as heating approximately in the range of 50-160 degrees Celsius. For example, in one embodiment, the water-soluble mask layer is soluble in aqueous solutions following exposure to chamber conditions used in a laser and plasma etch singulation process. In one embodiment, the water-soluble mask layer is composed of a material such as, but not limited to, polyvinyl alcohol, polyacrylic acid, dextran, polymethacrylic acid, polyethylene imine, or polyethylene oxide. In a specific embodiment, the water-soluble mask layer has an etch rate in an aqueous solution approximately in the range of 1-15 microns per minute and, more particularly, approximately 1.3 microns per minute.

In another embodiment, the mask 1802 is a UV-curable mask layer. In an embodiment, the mask layer has a susceptibility to UV light that reduces an adhesiveness of the UV-curable layer by at least approximately 80%. In one such embodiment, the UV layer is composed of polyvinyl chloride or an acrylic-based material. In an embodiment, the UV-curable layer is composed of a material or stack of materials with an adhesive property that weakens upon exposure to UV light. In an embodiment, the UV-curable adhesive film is sensitive to approximately 365 nm UV light. In one such embodiment, this sensitivity enables use of LED light to perform a cure.

In an embodiment, the semiconductor wafer or substrate 1804 is composed of a material suitable to withstand a fabrication process and upon which semiconductor processing layers may suitably be disposed. For example, in one embodiment, semiconductor wafer or substrate 1804 is composed of a group IV-based material such as, but not limited to, crystalline silicon, germanium or silicon/germanium. In a specific embodiment, providing semiconductor wafer 1804 includes providing a monocrystalline silicon substrate. In a particular embodiment, the monocrystalline silicon substrate is doped with impurity atoms. In another embodiment, semiconductor wafer or substrate 1804 is composed of a III-V material such as, e.g., a III-V material substrate used in the fabrication of light emitting diodes (LEDs).

In an embodiment, the semiconductor wafer or substrate 1804 has a thickness of approximately 300 microns or less. For example, in one embodiment, a bulk single-crystalline silicon substrate is thinned from the backside prior to being affixed to the die attach film 1816. The thinning may be performed by a backside grind process. In one embodiment, the bulk single-crystalline silicon substrate is thinned to a thickness approximately in the range of 50-300 microns. It is important to note that, in an embodiment, the thinning is performed prior to a laser ablation and plasma etch dicing process. In an embodiment, the die attach film 1816 (or any suitable substitute capable of bonding a thinned or thin wafer or substrate to the substrate carrier 1814) has a thickness of approximately 20 microns.

In an embodiment, the semiconductor wafer or substrate 1804 has disposed thereon or therein, as a portion of the integrated circuits 1806, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits 1806. Materials making up the streets 1807 may be similar to or the same as those materials used to form the integrated circuits 1806. For example, streets 1807 may be composed of layers of dielectric materials, semiconductor materials, and metallization. In one embodiment, one or more of the streets 1807 includes test devices similar to the actual devices of the integrated circuits 1806.

Referring to operation 1704 of Flowchart 1700, and corresponding FIG. 18B, the mask 1802 is patterned with a laser scribing process to provide a patterned mask 1808 with gaps 1810, exposing regions of the semiconductor wafer or substrate 1804 between the integrated circuits 1806. In one such embodiment, the laser scribing process is a femtosecond-based laser scribing process. The laser scribing process is used to remove the material of the streets 1807 originally formed between the integrated circuits 1806. In accordance with an embodiment of the present invention, patterning the mask 1802 with the laser scribing process includes forming trenches 1812 partially into the regions of the semiconductor wafer 1804 between the integrated circuits 1806, as is depicted in FIG. 18B.

In an embodiment, patterning the mask 1802 with the laser scribing process includes using a laser having a pulse width in the femtosecond range. Specifically, a laser with a wavelength in the visible spectrum plus the ultra-violet (UV) and infra-red (IR) ranges (totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the mask 1802, the streets 1807 and, possibly, a portion of the semiconductor wafer or substrate 1804.

Figure 19:
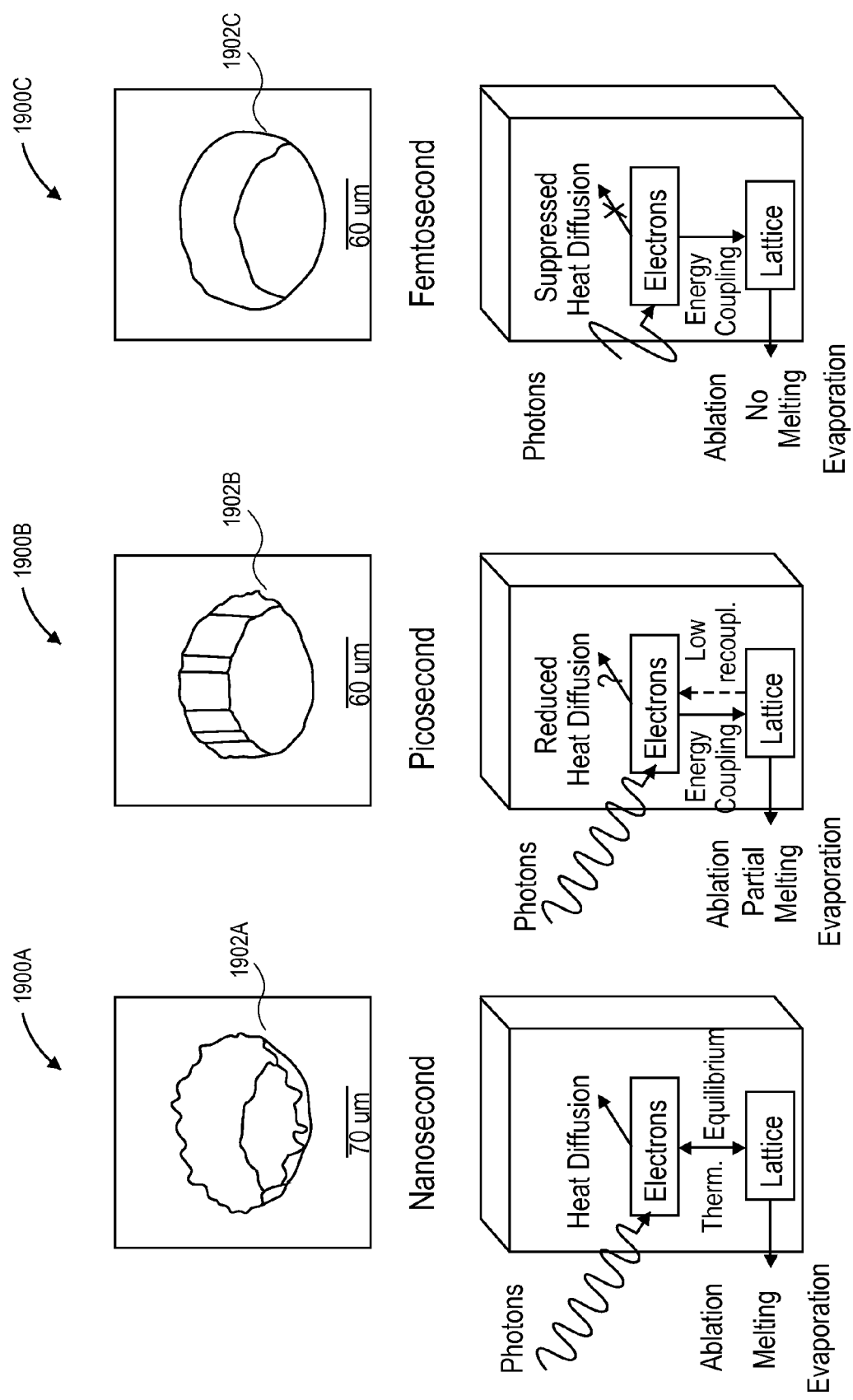
FIG. 19 illustrates the effects of using a laser pulse in the femtosecond range versus longer pulse times, in accordance with an embodiment of the present invention.

FIG. 19 illustrates the effects of using a laser pulse in the femtosecond range versus longer frequencies, in accordance with an embodiment of the present invention. Referring to FIG. 19, by using a laser with a pulse width in the femtosecond range heat damage issues are mitigated or eliminated (e.g., minimal to no damage 1902C with femtosecond processing of a via 1900C) versus longer pulse widths (e.g., damage 1902B with picosecond processing of a via 1900B and significant damage 1902A with nanosecond processing of a via 1900A). The elimination or mitigation of damage during formation of via 1900C may be due to a lack of low energy recoupling (as is seen for picosecond-based laser ablation) or thermal equilibrium (as is seen for nanosecond-based laser ablation), as depicted in FIG. 19.

Laser parameters selection, such as pulse width, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

By contrast, if non-optimal laser parameters are selected, in a stacked structure that involves, e.g., two or more of an inorganic dielectric, an organic dielectric, a semiconductor, or a metal, a laser ablation process may cause delamination issues. For example, a laser penetrate through high bandgap energy dielectrics (such as silicon dioxide with an approximately of 9 eV bandgap) without measurable absorption. However, the laser energy may be absorbed in an underlying metal or silicon layer, causing significant vaporization of the metal or silicon layers. The vaporization may generate high pressures to lift-off the overlying silicon dioxide dielectric layer and potentially causing severe interlayer delamination and microcracking. In an embodiment, while picoseconds-based laser irradiation processes lead to microcracking and delaminating in complex stacks, femtosecond-based laser irradiation processes have been demonstrated to not lead to microcracking or delamination of the same material stacks.

In order to be able to directly ablate dielectric layers, ionization of the dielectric materials may need to occur such that they behave similar to a conductive material by strongly absorbing photons. The absorption may block a majority of the laser energy from penetrating through to underlying silicon or metal layers before ultimate ablation of the dielectric layer. In an embodiment, ionization of inorganic dielectrics is feasible when the laser intensity is sufficiently high to initiate photon-ionization and impact ionization in the inorganic dielectric materials.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns.

The spacial beam profile at the work surface may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 uJ to 100 uJ, although preferably approximately in the range of 1 uJ to 5 uJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. The laser may be applied either in a train of single pulses at a given pulse repetition rate or a train of pulse bursts. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

Referring to operation 1706 of Flowchart 1700, a portion of the substrate is covered with a protective cover, e.g., to protect a tape and tape frame of the substrate carrier 1814 during plasma etching. In one embodiment, the protective cover is a shadow ring that leaves exposed a portion of, but not all of, the semiconductor wafer or substrate 1204, as described above in association with FIG. 10.

Referring to operation 1708 of Flowchart 1700, the tape frame of the substrate carrier 1814 is supported by a cooling tape frame lift. In one such embodiment, a tape frame lift such as described above in association with FIGS. 6-9 is used to support the tape frame of the substrate carrier 1814 below a shadow mask. In one embodiment, the shadow mask is a low contact shadow mask. In one embodiment, the cooling is achieved by flowing helium gas along cooling channels in a supporting surface of the tape frame lift.

Referring again to operations 1706 and 1708, in accordance with an optional embodiment of the present invention, a portion of the substrate carrier 1814 is covered with an actively-cooled shadow ring or a plasma thermal shield, or both, in preparation for an etch portion of the dicing process. In one embodiment, the actively-cooled shadow ring or a plasma thermal shield, or both, is included in a plasma etching chamber.

Referring to operation 1710 of Flowchart 1700, and corresponding FIG. 18C, the semiconductor wafer or substrate 1804 is then etched through the gaps 1810 in the patterned mask 1808 to singulate the integrated circuits 1806. In accordance with an embodiment of the present invention, etching the semiconductor wafer 1804 includes etching to extend the trenches 1812 formed with the laser scribing process and to ultimately etch entirely through semiconductor wafer or substrate 1804, as depicted in FIG. 18C.

In an embodiment, etching the semiconductor wafer or substrate 1804 includes using a plasma etching process. In one embodiment, a through-silicon via type etch process is used. For example, in a specific embodiment, the etch rate of the material of semiconductor wafer or substrate 1804 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. The combination enables effective decoupling of the ion density from ion energy, so as to achieve relatively high density plasmas without the high, potentially damaging, DC bias levels, even at very low pressures. An exceptionally wide process window results. However, any plasma etch chamber capable of etching silicon may be used. In an exemplary embodiment, a deep silicon etch is used to etch a single crystalline silicon substrate or wafer 1804 at an etch rate greater than approximately 40% of conventional silicon etch rates while maintaining essentially precise profile control and virtually scallop-free sidewalls. In a specific embodiment, a through-silicon via type etch process is used. The etch process is based on a plasma generated from a reactive gas, which generally a fluorine-based gas such as $SF_6$, $C_4F_8$, $CHF_3$, $XeF_2$, or any other reactant gas capable of etching silicon at a relatively fast rate. In one embodiment, however, a Bosch process is used which involves formation of a scalloped profile.

In an embodiment, singulation may further include patterning of die attach film 1816. In one embodiment, die attach film 1816 is patterned by a technique such as, but not limited to, laser ablation, dry (plasma) etching or wet etching. In an embodiment, the die attach film 1816 is patterned in sequence following the laser scribe and plasma etch portions of the singulation process to provide die attach film portions 1818, as depicted in FIG. 18C. In an embodiment, the patterned mask 1808 is removed after the laser scribe and plasma etch portions of the singulation process, as is also depicted in FIG. 18C. The patterned mask 1808 may be removed prior to, during, or following patterning of the die attach film 1816. In an embodiment, the semiconductor wafer or substrate 1804 is etched while supported by the substrate carrier 1814. In an embodiment, the die attach film 1816 is also patterned while disposed on the substrate carrier 1814.

Accordingly, referring again to Flowchart 1700 and FIGS. 18A-18C, wafer dicing may be preformed by initial laser ablation through a mask, through wafer streets (including metallization), and partially into a silicon substrate. The laser pulse width may be selected in the femtosecond range. Die singulation may then be completed by subsequent through-silicon deep plasma etching. In one embodiment, a cooled tape frame lift assembly is implemented during the etch portion of the dicing process. In one same or different embodiment, an actively-cooled shadow ring or a plasma thermal shield, or both, are implemented during the etch portion of the dicing process. Additionally, removal of exposed portions of the die attach film is performed to provide singulated integrated circuits, each having a portion of a die attach film thereon. The individual integrated circuits, including die attach film portions may then be removed from the substrate carrier 1814, as depicted in FIG. 18C. In an embodiment, the singulated integrated circuits are removed from the substrate carrier 1814 for packaging. In one such embodiment, the patterned die attach film 1818 is retained on the backside of each integrated circuit and included in the final packaging. However, in another embodiment, the patterned die attach film 1814 is removed during or subsequent to the singulation process.

Referring again to FIGS. 18A-18C, the plurality of integrated circuits 1806 may be separated by streets 1807 having a width of approximately 10 microns or smaller. The use of a laser scribing approach (such as a femtosecond-based laser scribing approach) may enable such compaction in a layout of integrated circuits, at least in part due to the tight profile control of the laser. For example, FIG. 20 illustrates compaction on a semiconductor wafer or substrate achieved by using narrower streets versus conventional dicing which may be limited to a minimum width, in accordance with an embodiment of the present invention.

Figure 20:
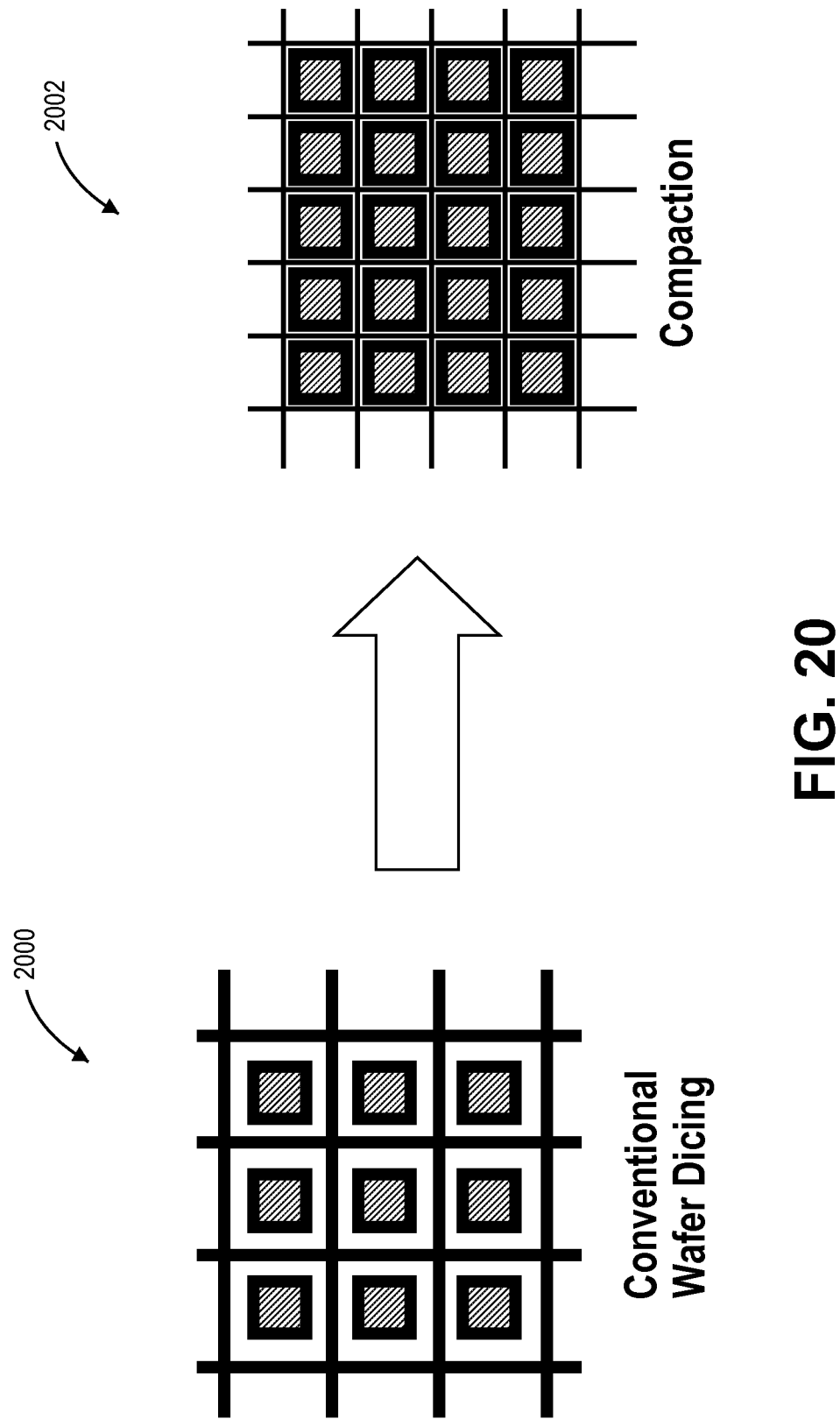
FIG. 20 illustrates compaction on a semiconductor wafer achieved by using narrower streets versus conventional dicing which may be limited to a minimum width, in accordance with an embodiment of the present invention.

Referring to FIG. 20, compaction on a semiconductor wafer is achieved by using narrower streets (e.g., widths of approximately 10 microns or smaller in layout 2002) versus conventional dicing which may be limited to a minimum width (e.g., widths of approximately 70 microns or larger in layout 2000). It is to be understood, however, that it may not always be desirable to reduce the street width to less than 10 microns even if otherwise enabled by a femtosecond-based laser scribing process. For example, some applications may require a street width of at least 40 microns in order to fabricate dummy or test devices in the streets separating the integrated circuits.

Figure 21:
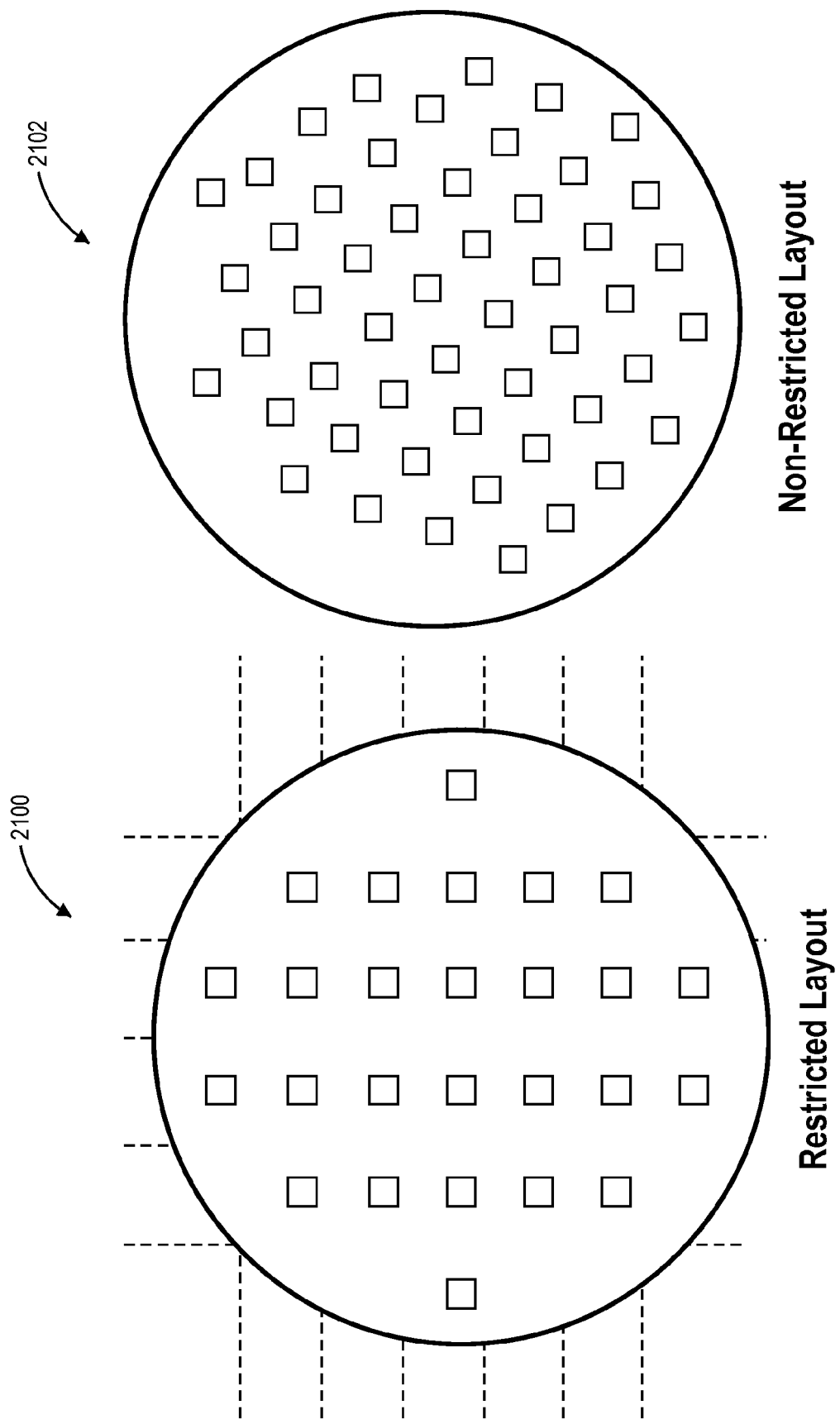
FIG. 21 illustrates freeform integrated circuit arrangement allowing denser packing and, hence, more die per wafer versus grid alignment approaches, in accordance with an embodiment of the present invention.

Referring again to FIGS. 18A-18C, the plurality of integrated circuits 1806 may be arranged on semiconductor wafer or substrate 1804 in a non-restricted layout. For example, FIG. 21 illustrates a freeform integrated circuit arrangement allowing denser packing. The denser packing may provide for more die per wafer versus grid alignment approaches, in accordance with an embodiment of the present invention. Referring to FIG. 21, a freeform layout (e.g., a non-restricted layout on semiconductor wafer or substrate 2102) allows denser packing and hence more die per wafer versus grid alignment approaches (e.g., a restricted layout on semiconductor wafer or substrate 2100). In an embodiment, the speed of the laser ablation and plasma etch singulation process is independent of die size, layout or the number of streets.

A single process tool may be configured to perform many or all of the operations in a hybrid laser ablation and plasma etch singulation process. For example, FIG. 22 illustrates a block diagram of a tool layout for laser and plasma dicing of wafers or substrates, in accordance with an embodiment of the present invention.

Figure 22:
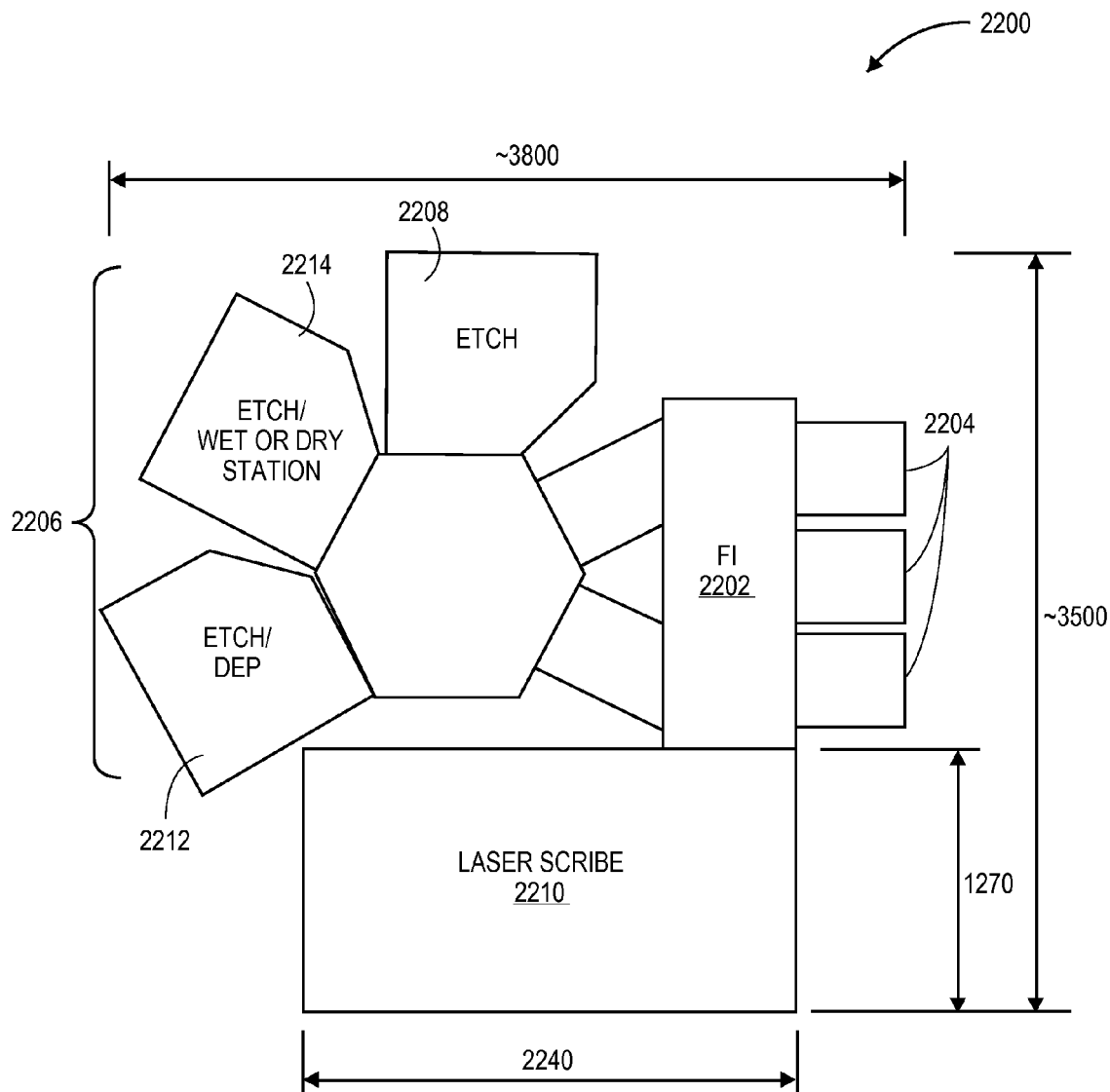
FIG. 22 illustrates a block diagram of a tool layout for laser and plasma dicing of wafers or substrates, in accordance with an embodiment of the present invention.

Referring to FIG. 22, a process tool 2200 includes a factory interface 2202 (FI) having a plurality of load locks 2204 coupled therewith. A cluster tool 2206 is coupled with the factory interface 2202. The cluster tool 2206 includes one or more plasma etch chambers, such as plasma etch chamber 2208. A laser scribe apparatus 2210 is also coupled to the factory interface 2202. The overall footprint of the process tool 2200 may be, in one embodiment, approximately 3500 millimeters (3.5 meters) by approximately 3800 millimeters (3.8 meters), as depicted in FIG. 22.

In an embodiment, the laser scribe apparatus 2210 houses a femtosecond-based laser. The femtosecond-based laser may be suitable for performing a laser ablation portion of a hybrid laser and etch singulation process, such as the laser abalation processes described above. In one embodiment, a moveable stage is also included in laser scribe apparatus 2200, the moveable stage configured for moving a wafer or substrate (or a carrier thereof) relative to the femtosecond-based laser. In a specific embodiment, the femtosecond-based laser is also moveable. The overall footprint of the laser scribe apparatus 2210 may be, in one embodiment, approximately 2240 millimeters by approximately 1270 millimeters, as depicted in FIG. 22.

In an embodiment, the one or more plasma etch chambers 2208 is configured for etching a wafer or substrate through the gaps in a patterned mask to singulate a plurality of integrated circuits. In one such embodiment, the one or more plasma etch chambers 2208 is configured to perform a deep silicon etch process. In a specific embodiment, the one or more plasma etch chambers 2208 is an Applied Centura® Silvia™ Etch system, available from Applied Materials of Sunnyvale, Calif., USA. The etch chamber may be specifically designed for a deep silicon etch used to create singulate integrated circuits housed on or in single crystalline silicon substrates or wafers. In an embodiment, a high-density plasma source is included in the plasma etch chamber 2208 to facilitate high silicon etch rates. In an embodiment, more than one etch chamber is included in the cluster tool 2206 portion of process tool 2200 to enable high manufacturing throughput of the singulation or dicing process. In accordance with an embodiment of the present invention, one or more of the etch chambers is equipped with a cooled tape frame lift assembly. In one same or different embodiment, one or more of the etch chambers is equipped with an actively-cooled shadow ring or a plasma thermal shield, or both.

The factory interface 2202 may be a suitable atmospheric port to interface between an outside manufacturing facility with laser scribe apparatus 2210 and cluster tool 2206. The factory interface 2202 may include robots with arms or blades for transferring wafers (or carriers thereof) from storage units (such as front opening unified pods) into either cluster tool 2206 or laser scribe apparatus 2210, or both.

Cluster tool 2206 may include other chambers suitable for performing functions in a method of singulation. For example, in one embodiment, in place of an additional etch chamber, a deposition chamber 2212 is included. The deposition chamber 2212 may be configured for mask deposition on or above a device layer of a wafer or substrate prior to laser scribing of the wafer or substrate. In one such embodiment, the deposition chamber 2212 is suitable for depositing a water soluble mask layer. In another embodiment, in place of an additional etch chamber, a wet/dry station 2214 is included. The wet/dry station may be suitable for cleaning residues and fragments, or for removing a water soluble mask, subsequent to a laser scribe and plasma etch singulation process of a substrate or wafer. In an embodiment, a metrology station is also included as a component of process tool 2200.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with process tool 2200 described in association with FIG. 22 or with etch chamber 1600 described in association with FIG. 16. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 23:
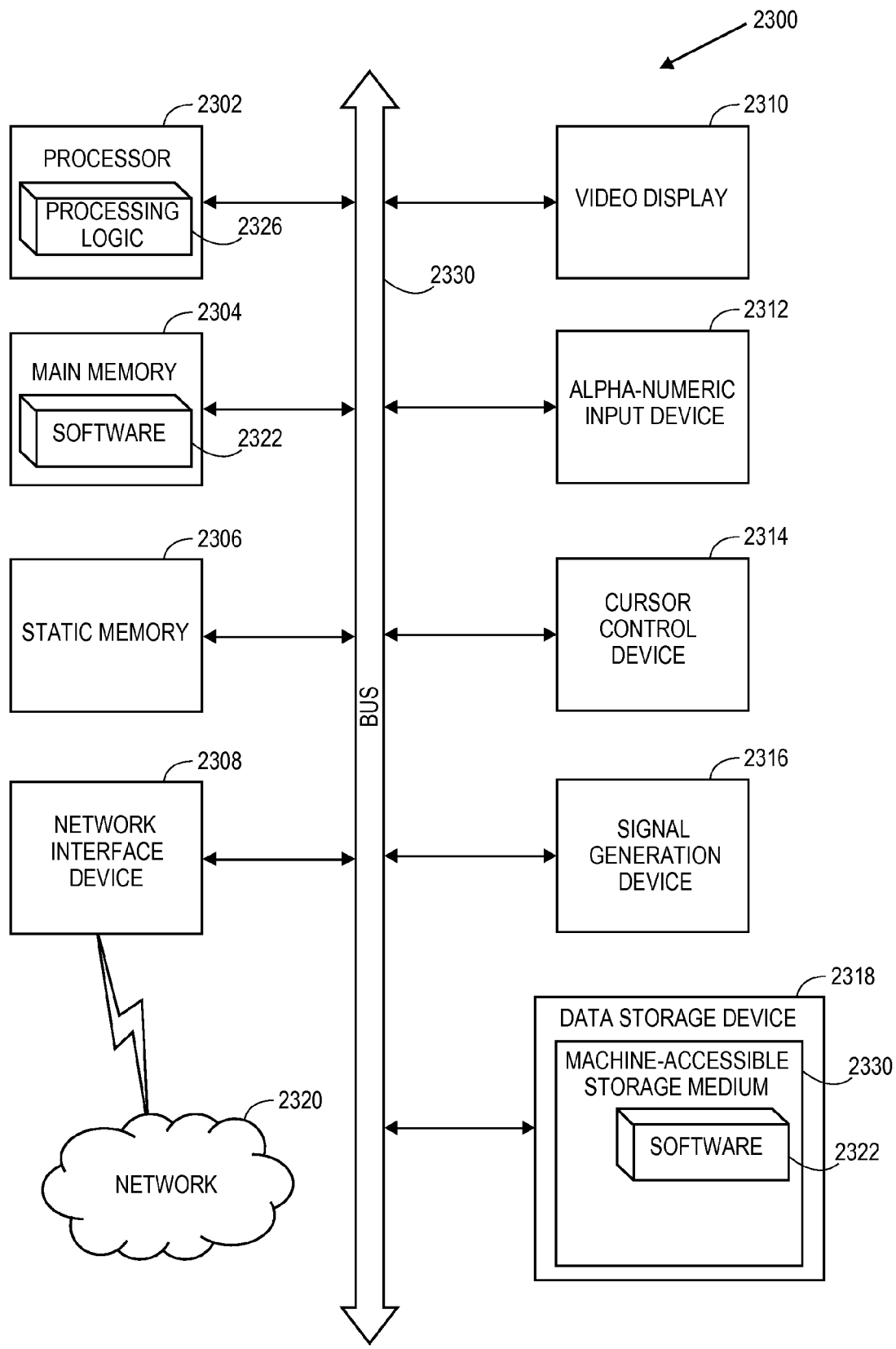
FIG. 23 illustrates a block diagram of an exemplary computer system, in accordance with an embodiment of the present invention.

FIG. 23 illustrates a diagrammatic representation of a machine in the exemplary form of a computer system 2300 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 2300 includes a processor 2302, a main memory 2304 (e.g., read-only memory (ROM), flash memory, dynamic random access memory (DRAM) such as synchronous DRAM (SDRAM) or Rambus DRAM (RDRAM), etc.), a static memory 2306 (e.g., flash memory, static random access memory (SRAM), etc.), and a secondary memory 2318 (e.g., a data storage device), which communicate with each other via a bus 2330.

Processor 2302 represents one or more general-purpose processing devices such as a microprocessor, central processing unit, or the like. More particularly, the processor 2302 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 2302 may also be one or more special-purpose processing devices such as an application specific integrated circuit (ASIC), a field programmable gate array (FPGA), a digital signal processor (DSP), network processor, or the like. Processor 2302 is configured to execute the processing logic 2326 for performing the operations described herein.

The computer system 2300 may further include a network interface device 2308. The computer system 2300 also may include a video display unit 2310 (e.g., a liquid crystal display (LCD), a light emitting diode display (LED), or a cathode ray tube (CRT)), an alphanumeric input device 2312 (e.g., a keyboard), a cursor control device 2314 (e.g., a mouse), and a signal generation device 2316 (e.g., a speaker).

The secondary memory 2318 may include a machine-accessible storage medium (or more specifically a computer-readable storage medium) 2331 on which is stored one or more sets of instructions (e.g., software 2322) embodying any one or more of the methodologies or functions described herein. The software 2322 may also reside, completely or at least partially, within the main memory 2304 and/or within the processor 2302 during execution thereof by the computer system 2300, the main memory 2304 and the processor 2302 also constituting machine-readable storage media. The software 2322 may further be transmitted or received over a network 2320 via the network interface device 2308.

While the machine-accessible storage medium 2331 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform a method of dicing a semiconductor wafer having a plurality of integrated circuits. The method involves introducing a substrate supported by a substrate carrier into a plasma etch chamber, the substrate having a patterned mask thereon covering integrated circuits and exposing streets of the substrate, and the substrate carrier having a tape frame. The method also involves supporting the substrate carrier on a cooled tape frame lift below a shadow ring. The method also involves plasma etching the substrate through the streets to singulate the integrated circuits. The shadow ring protects the substrate carrier from the plasma etching, and the cooled tape frame lift draws heat away from the tape frame of the substrate carrier.

Thus, methods of and apparatuses for dicing semiconductor wafers, each wafer having a plurality of integrated circuits, have been disclosed.

What is claimed is:

1. A tape frame lift assembly for a plasma processing chamber, the tape frame lift assembly comprising:
   a capture single ring having an upper surface for supporting a tape frame of a substrate support and for cooling the tape frame, wherein the upper surface of the capture single ring comprises a plurality of channels for flowing helium (He) gas as a cooling fluid, wherein the capture single ring is an annular ring, and wherein the plurality of channels for flowing the cooling fluid comprises one or more radial channels and one or more circumferential channels;
   one or more capture lift arms for moving the capture single ring to and from transferring and processing positions; and
   one or more captured lift plate portions, one captured lift plate portion corresponding to one capture lift arm, the one or more captured lift plate portions for coupling the one or more capture lift arms to the capture single ring.

2. The tape frame lift assembly for a plasma process chamber according to claim 1, wherein the upper surface of the capture single ring further comprises a raised perimeter edge surrounding a tape frame contact surface, the tape frame contact surface comprising the plurality of channels for flowing the He gas.

3. The tape frame lift assembly for a plasma process chamber according to claim 1, wherein the capture single ring comprises one or more capture locations, one capture location corresponding to one captured lift plate portion.

4. The tape frame lift assembly for a plasma process chamber according to claim 3, wherein each of the one or more capture locations is a three-sided, tapered pocket.

5. A shadow ring assembly for a plasma processing chamber, the shadow ring assembly comprising:
   a shadow ring having an annular body and an inner opening for accommodating an etch cathode; and
   a tape frame lift assembly disposed below the shadow ring, the tape frame lift assembly comprising:
      a capture single ring having an upper surface for supporting a tape frame of a substrate support and for cooling the tape frame, wherein the capture single ring is an annular ring with an inner opening for accommodating the etch cathode, and wherein during processing both the capture single ring and the shadow ring contact the tape frame of the substrate support, wherein the upper surface of the capture single ring comprises a plurality of channels for flowing a cooling fluid, the plurality of channels comprising one or more radial channels and one or more circumferential channels, wherein the capture single ring comprises one or more capture locations, one capture location corresponding to one captured lift plate portion, and wherein each of the one or more capture locations is a three-sided, tapered pocket;
      one or more capture lift arms for moving the capture single ring to and from transferring and processing positions; and
      one or more captured lift plate portions, one captured lift plate portion corresponding to one capture lift arm, the one or more captured lift plate portions for coupling the one or more capture lift arms to the capture single ring.

6. The shadow ring assembly for a plasma processing chamber according to claim 5, wherein the upper surface of the capture single ring comprises a raised perimeter edge surrounding a tape frame contact surface, wherein a bottom surface of the shadow ring comprises a raised perimeter edge surrounding a tape frame contact surface, and wherein during processing the tape frame is held between and in contact with both the tape frame contact surface of the upper surface of the capture single ring and the tape frame contact surface bottom surface of the shadow ring.

7. The shadow ring assembly for a plasma processing chamber according to claim 6, wherein during processing, the raised perimeter edge of the upper surface of the capture single ring and the raised perimeter edge of the bottom surface of the shadow ring are in contact and in alignment with one another.

8. The shadow ring assembly for a plasma processing chamber according to claim 6, wherein the tape frame contact surface of the bottom surface of the shadow ring comprises a recess to reduce surface area contact with the tape frame of the substrate support.

9. The shadow ring assembly for a plasma processing chamber according to claim 5, further comprising:
   a plasma thermal shield nested on the shadow ring.

10. The shadow ring assembly for a plasma processing chamber according to claim 5, wherein the shadow ring further comprises a cooling channel disposed in the annular body of the shadow ring for cooling fluid transport, the cooling channel coupled to a pair of supply/return openings at a surface of the annular body of the shadow ring.

11. A method of dicing a semiconductor wafer comprising a plurality of integrated circuits, the method comprising:
   introducing a substrate supported by a substrate carrier into a plasma etch chamber, the substrate having a patterned mask thereon covering integrated circuits and exposing streets of the substrate, and the substrate carrier having a tape frame;
   supporting the substrate carrier on a cooled tape frame lift below a shadow ring, wherein supporting the substrate carrier on the cooled tape frame lift below the shadow ring comprises flowing helium (He) gas between a tape frame of the substrate carrier and a surface of a capture single ring of the cooled tape frame lift, and wherein supporting the substrate carrier on the cooled tape frame lift below the shadow ring comprises contacting the tape frame of the substrate carrier from below by a surface of a capture single ring of the cooled tape frame lift and from above by a surface of the shadow ring, the surface of the shadow ring having a recess for reducing surface area contact with the tape frame; and plasma etching the substrate through the streets to singulate the integrated circuits, wherein the shadow ring protects the substrate carrier from the plasma etching, and wherein the cooled tape frame lift draws heat away from the tape frame of the substrate carrier.

12. The method of claim 11, wherein the shadow ring has cooling channels therein, and wherein the He gas is transported through the cooling channels during the plasma etching.

13. The method of claim 11, further comprising:
forming the patterned mask with a laser scribing process.

* * * * *